(12) United States Patent
Kasahara

(10) Patent No.: US 10,403,655 B2
(45) Date of Patent: Sep. 3, 2019

(54) METHOD FOR MANUFACTURING SEMICONDUCTOR DEVICE

(71) Applicant: SEMICONDUCTOR ENERGY LABORATORY CO., LTD., Atsugi-shi, Kanagawa-ken (JP)

(72) Inventor: Takahiro Kasahara, Kanagawa (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 16/157,158

(22) Filed: Oct. 11, 2018

(65) Prior Publication Data

US 2019/0043899 A1 Feb. 7, 2019

Related U.S. Application Data

(60) Continuation of application No. 15/407,287, filed on Jan. 17, 2017, now Pat. No. 10,128,282, which is a
(Continued)

(30) Foreign Application Priority Data

Apr. 4, 2013 (JP) .................................. 2013-078908

(51) Int. Cl.
*H01L 27/12* (2006.01)
*H01L 21/28* (2006.01)
(Continued)

(52) U.S. Cl.
CPC .... *H01L 27/1288* (2013.01); *H01L 21/28008* (2013.01); *H01L 27/124* (2013.01);
(Continued)

(58) Field of Classification Search
CPC .............. H01L 27/124; H01L 27/1288; H01L 27/1259; H01L 21/32139; H01L 21/475;
(Continued)

(56) References Cited

U.S. PATENT DOCUMENTS 5,621,556 A 4/1997 Fulks et al.
5,682,211 A 10/1997 Yao et al.
(Continued)

FOREIGN PATENT DOCUMENTS

EP 0679922 A 11/1995
EP 0745885 A 12/1996
(Continued)

OTHER PUBLICATIONS

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Bac H Au
(74) *Attorney, Agent, or Firm* — Nixon Peabody LLP; Jeffrey L. Costellia

(57) ABSTRACT

The number of masks and photolithography processes used in a manufacturing process of a semiconductor device are reduced. A first conductive film is formed over a substrate; a first insulating film is formed over the first conductive film; a semiconductor film is formed over the first insulating film; a semiconductor film including a channel region is formed by etching part of the semiconductor film; a second insulating film is formed over the semiconductor film; a mask is formed over the second insulating film; a first portion of the second insulating film that overlaps the semiconductor film and second portions of the first insulating film and the second insulating film that do not overlap the semiconductor film are removed with the use of the mask; the mask is removed; and a second conductive film electrically connected to the semiconductor film is formed over at least part of the second insulating film.

6 Claims, 15 Drawing Sheets

Related U.S. Application Data division of application No. 14/219,752, filed on Mar. 19, 2014, now Pat. No. 9,570,310.

(51) Int. Cl.
| | | |
|---|---|---|
| *H01L 29/66* | (2006.01) | |
| *H01L 29/786* | (2006.01) | |
| *G02F 1/1368* | (2006.01) | |
| *G02F 1/1362* | (2006.01) | |
| *H01L 27/32* | (2006.01) | |

(52) U.S. Cl.
CPC .... *H01L 27/1225* (2013.01); *H01L 29/66969* (2013.01); *H01L 29/7869* (2013.01); *G02F 1/1368* (2013.01); *G02F 2001/136236* (2013.01); *H01L 27/3262* (2013.01); *H01L 2227/323* (2013.01)

(58) Field of Classification Search
CPC ......... H01L 21/47573; H01L 21/76802; H01L 21/76877; H01L 29/7869; G02F 2001/136236
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 5,867,242 A | 2/1999 | Yao et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 6,822,703 B2 | 11/2004 | Hwang et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,315,076 B2 | 1/2008 | Nomura et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,786,482 B2 | 8/2010 | Yamazaki et al. |
| 7,824,939 B2 | 11/2010 | Hosoya et al. |
| 7,846,618 B2 | 12/2010 | Chai et al. |
| 7,915,074 B2 | 3/2011 | Yoon |
| 7,952,099 B2 | 5/2011 | Deng et al. |
| 8,101,445 B2 | 1/2012 | Koo et al. |
| 8,129,719 B2 | 3/2012 | Yamazaki et al. |
| 8,284,142 B2 | 10/2012 | Yamazaki et al. |
| 8,314,423 B2 | 11/2012 | Chen et al. |
| 8,378,946 B2 | 2/2013 | Toyota et al. |
| 8,461,630 B2 | 6/2013 | Endo et al. |
| 8,530,285 B2 | 9/2013 | Yamazaki et al. |
| 8,685,803 B2 | 4/2014 | Chikama et al. |
| 8,686,425 B2 | 4/2014 | Yamazaki et al. |
| 8,822,264 B2 | 9/2014 | Yamazaki et al. |
| 8,884,284 B2 | 11/2014 | Koyama |
| 8,927,981 B2 | 1/2015 | Akimoto et al. |
| 9,034,104 B2 | 5/2015 | Yamazaki et al. |
| 9,048,147 B2 | 6/2015 | Yamazaki et al. |
| 9,054,134 B2 | 6/2015 | Yamazaki et al. |
| 9,196,713 B2 | 11/2015 | Yamazaki et al. |
| 9,563,094 B2 | 2/2017 | Yamazaki et al. |
| 9,859,401 B2 | 1/2018 | Yamazaki et al. |
| 9,911,865 B2 | 3/2018 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0142680 A1 | 6/2005 | Ha et al. |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0146592 A1 | 6/2007 | Kimura |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0140438 A1 | 6/2009 | Yamazaki et al. |
| 2009/0152506 A1 | 6/2009 | Umeda et al. |
| 2009/0152541 A1 | 6/2009 | Maekawa et al. |
| 2009/0159885 A1 | 6/2009 | Yamazaki et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0096645 A1 | 4/2010 | Sonoda et al. |

(56) References Cited

U.S. PATENT DOCUMENTS

| | | | |
|---|---|---|---|
| 2010/0109002 | A1 | 5/2010 | Itagaki et al. |
| 2010/0140613 | A1 | 6/2010 | Kimura |
| 2010/0270538 | A1 | 10/2010 | Kang |
| 2010/0327281 | A1 | 12/2010 | Nakajima et al. |
| 2011/0084268 | A1 | 4/2011 | Yamazaki et al. |
| 2012/0081715 | A1 | 4/2012 | Takano |
| 2012/0188478 | A1 | 7/2012 | Kuwabara |
| 2013/0161609 | A1 | 6/2013 | Koyama |
| 2014/0004704 | A1 | 1/2014 | Hung et al. |
| 2015/0064841 | A1 | 3/2015 | Koyama |
| 2018/0145153 | A1 | 5/2018 | Yamazaki et al. |
| 2018/0190834 | A1 | 7/2018 | Yamazaki et al. |

FOREIGN PATENT DOCUMENTS

| | | |
|---|---|---|
| EP | 0745886 A | 12/1996 |
| EP | 1737044 A | 12/2006 |
| EP | 2073255 A | 6/2009 |
| EP | 2226847 A | 9/2010 |
| EP | 2511896 A | 10/2012 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 08-328041 A | 12/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2002-333641 A | 11/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-011920 A | 1/2005 |
| JP | 2009-124124 A | 6/2009 |
| JP | 2009-158940 A | 7/2009 |
| JP | 2009-170900 A | 7/2009 |
| JP | 2010-080947 A | 4/2010 |
| JP | 2010-097077 A | 4/2010 |
| JP | 2010-109342 A | 5/2010 |
| JP | 2010-129859 A | 6/2010 |
| JP | 2010-272691 A | 12/2010 |
| JP | 2011-146698 A | 7/2011 |
| JP | 2011-155249 A | 8/2011 |
| JP | 2011-155303 A | 8/2011 |
| JP | 2012-178545 A | 9/2012 |
| JP | 2013-149961 A | 8/2013 |
| WO | WO-2004/114391 | 12/2004 |
| WO | WO-2011/070981 | 6/2011 |
| WO | WO-2011/074506 | 6/2011 |
| WO | WO-2011/081009 | 7/2011 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:AL and SN-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using Castep", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paperitransparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al. "Native Point Defects in ZnO", Phys. Rev. B (Physical Review. B), Oct. 4, 2007, vol. 76, No. 16, pp. 165202-1-165202-22.

Janotti.A et al. "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2: Invited Paper:Fast Electro-Optical Switching in Polymer-Stabilized Liquid Crystalline Blue Phases for Dis-

(56) References Cited

OTHER PUBLICATIONS play Application", SID Digest '07 : SID International Symposium Digest of Technical Papers, 2007, vol. 38, pp. 1737-1740.
Kikuchi.H et al. "Polymer-Stabilized Liquid Crystal Blue Phases", Nature Materials, Sep. 2, 2002, vol. 1, pp. 64-68.
Kim.S et al., "High-Performance oxide thin film transistors passivated by various gas plasmas", 214th ECS MEETING, 2008, No. 2317, ECS.
Kimizuka.N. et al., "Spinel,YBFE2O4, and YB2FE3O7 Types of Structures for Compounds in The In2O3 and Sc2O3—A2O3—Bo Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.
Kimizuka.N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits, 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED ", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "Suftla Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Nomura.K et al., "Carrier transport in transparent oxide semiconductor with intrinsic structural randomness probed using single-crystalline InGaOS(ZnO)5 films", Appl. Phys. Lett. (Applied Physics Letters), Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Oba.F et al. "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 in. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.
Park.S et al. "Challenge to Future Displays: Transparent AM-OLED Driven by Peald Grown ZnO TFT", IMID '07 Digest, 2007, pp. 1249-1252.
Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters) , Jun. 17, 1996, vol. 68, No. 25, pp. 3650-3652.
Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous Gizo (Ga2O3—In2O3—ZnO) TFT", SID Digest '08 : SID International Symposium Digest of Technical Papers, May 20, 2008, vol. 39, pp. 633-636.

(56) References Cited

OTHER PUBLICATIONS

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs ", IDW '02 : Proceedings of the 9th International Display Workshops, Dec. 4, 2002, pp. 295-298.
Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

METHOD FOR MANUFACTURING SEMICONDUCTOR DEVICE

BACKGROUND OF THE INVENTION

1. Field of the Invention

The present invention relates to a semiconductor device and a method for manufacturing the semiconductor device.

2. Description of the Related Art

In recent years, transistors that are formed using a semiconductor thin film having a thickness of several nanometers to several hundreds of nanometers over a substrate having an insulating surface such as a glass substrate have been attracting attentions. Transistors are widely used for electronic devices such as ICs (integrated circuits) and electro-optical devices. In addition, transistors are used as switching elements of active matrix display devices typified by liquid crystal display devices and active matrix light-emitting devices typified by light-emitting devices including organic electroluminescence (EL) elements.

The ranges of uses of such an active matrix display device and such a light-emitting device are expanding, and demands for larger screen size, higher definition, and higher aperture ratio are increasing. In addition, these devices are required to have high reliability, and production methods of these devices are required to provide high yield and to have low production cost.

A reduction in the number of photolithography processes in manufacture of transistors for an active matrix display device and an active matrix light-emitting device is important for cost reduction. For example, one photomask for the eighth generation glass substrate costs tens of millions of yen, and one photomask for the tenth generation glass substrate or the eleventh generation glass substrate costs hundreds of millions of yen. Moreover, even when only one photolithography step is added in the manufacturing process, the number of steps relating to the photolithography step is significantly increased. Therefore, many techniques for reducing the number of photolithography processes have been developed.

As typical means for reducing the number of photolithography processes in a manufacturing process of a transistor, a technique using a multi-tone mask (also called a half-tone mask or a gray-tone mask) is widely known. As examples of the known technique for reducing the number of manufacturing steps by using a multi-tone mask, Patent Documents 1 to 3 are given.

Patent Document 1: Japanese Published Patent Application No. 2012-178545
Patent Document 2: Japanese Published Patent Application No. 2011-155303
Patent Document 3: Japanese Published Patent Application No. 2009-124124

SUMMARY OF THE INVENTION

An object of one embodiment of the present invention is to reduce the number of masks used in a manufacturing process of a semiconductor device. Another object is to reduce the number of photolithography processes. Another object is to reduce the manufacturing time of a semiconductor device. Another object is to reduce the manufacturing cost of a semiconductor device.

One embodiment of the present invention is a method for manufacturing a semiconductor device that includes the steps of forming a first conductive film over a substrate; forming a first insulating film over the first conductive film; forming a semiconductor film over the first insulating film; forming a semiconductor film including a channel region by etching at least part of the semiconductor film; forming a second insulating film over the semiconductor film including the channel region; forming a mask over the second insulating film; performing a first step in which at the same time as removing a first portion of the second insulating film that overlaps the semiconductor film including the channel region and that the mask does not overlap, second portions of the first insulating film and the second insulating film that do not overlap the semiconductor film including the channel region and that the mask does not overlap are removed; removing the mask after the first step; and forming a second conductive film electrically connected to the semiconductor film including the channel region over at least part of the second insulating film.

It is preferable that in the above-described method, the mask be made to recede to expose part of the second insulating film and the part of the second insulating film be removed between the first step and the removal of the mask.

Another embodiment of the present invention is a method for manufacturing a semiconductor device that includes the steps of forming a first conductive film over a substrate; forming a first insulating film over the first conductive film; forming a semiconductor film over the first insulating film; forming a semiconductor film including a channel region by etching at least part of the semiconductor film; forming a second insulating film over the semiconductor film including the channel region; forming a mask including a first region and a second region having a thickness smaller than that of the first region over the second insulating film; performing a first step of removing portions of the first insulating film and the second insulating film that the mask does not overlap; performing a second step of removing part of the mask that is in the second region by making the mask recede after the first step; performing a third step of removing a portion of the second insulating film that the second region overlaps after the second step; removing the mask after the third step; and forming a second conductive film electrically connected to the semiconductor film including the channel region over at least part of the second insulating film.

Another embodiment of the present invention is a method for manufacturing a semiconductor device that includes the steps of forming a first conductive film over a substrate; forming a first insulating film over the first conductive film; forming a semiconductor film over the first insulating film; forming a mask including a first region and a second region having a thickness smaller than that of the first region over the semiconductor film; performing a first step of forming an opening in the first insulating film by removing portions of the first insulating film and the semiconductor film that the mask does not overlap; performing a second step of removing part of the mask that is in the second region by making the mask recede after the first step; performing a third step of forming a semiconductor film including a channel region by removing a portion of the semiconductor film that the second region overlaps after the second step; removing the mask after the third step; forming a second insulating film over the semiconductor film including the channel region; removing at least a portion of the second insulating film that overlaps the opening; and forming a second conductive film electrically connected to the semiconductor film including the channel region over at least part of the second insulating film.

Another embodiment of the present invention is a method for manufacturing a semiconductor device that includes the steps of: forming a first electrode over a substrate; forming a first insulating film over the first electrode; forming a second insulating film over the first insulating film; forming a first conductive film over the second insulating film; forming a mask including a first region and a second region having a thickness smaller than that of the first region over the first conductive film; performing a first step of removing portions of the first insulating film, the second insulating film, and the first conductive film that the mask does not overlap; performing a second step of removing part of the mask that is in the second region by making the mask recede after the first step; performing a third step of removing portions of the first conductive film that the second region overlaps after the second step; removing the mask after the third step; forming a third insulating film over at least part of the second insulating film; and forming a second conductive film electrically connected to the first electrode over at least part of the third insulating film.

In the above-described method, a step of forming a semiconductor film over the substrate, a step of forming a fourth insulating film over the semiconductor film, and a step of forming a first opening in the fourth insulating film may be performed before the formation of the first electrode. In the above-described method, the first electrode may be electrically connected to the semiconductor film through the first opening formed in the fourth insulating film. In the above-described method, the semiconductor film may include an oxide semiconductor. In the above-described method, the first opening may have a tapered shape. In the above-described method, an opening formed in the second insulating film by the first step may have a tapered shape. In the above-described method, an opening formed in the first insulating film by the first step may have a tapered shape. In the above-described method, the third insulating film may have tapered side surfaces.

Another embodiment of the present invention is a method for manufacturing a semiconductor device that includes the steps of: forming a first electrode over a substrate; forming a first insulating film over the first electrode; forming a second insulating film over the first insulating film; forming a first conductive film over the second insulating film; forming a mask including a first region and a second region having a thickness smaller than that of the first region over the first conductive film; performing a first step of removing portions of the first insulating film, the second insulating film, and the first conductive film that the mask does not overlap; performing a second step of removing part of the mask that is in the second region by making the mask recede after the first step; performing a third step of removing portions of the first conductive film that the second region overlaps after the second step; removing the mask after the third step; forming a third insulating film over at least part of a top surface of the second insulating film and on at least part of a side surface of the second insulating film in an opening formed in the second insulating film by the first step; and forming a second conductive film electrically connected to the first electrode over at least part of the third insulating film.

Another embodiment of the present invention is a method for manufacturing a semiconductor device that includes the steps of: forming a first electrode over a substrate; forming a first insulating film over the first electrode; forming a second insulating film over the first insulating film; forming a first conductive film over the second insulating film; forming a mask including a first region and a second region having a thickness smaller than that of the first region over the first conductive film; performing a first step of removing portions of the first insulating film, the second insulating film, and the first conductive film that the mask does not overlap; performing a second step of removing part of the mask that is in the second region by making the mask recede after the first step; performing a third step of removing portions of the first conductive film that the second region overlaps after the second step; removing the mask after the third step; forming a third insulating film over at least part of a top surface of the second insulating film, on a side surface of the second insulating film in an opening formed in the second insulating film by the first step, and over at least part of the first electrode; and forming a second conductive film electrically connected to the first electrode over at least part of the third insulating film.

According to one embodiment of the present invention, the number of masks used in a manufacturing process of a semiconductor device can be reduced. The number of photolithography processes can also be reduced. The manufacturing time of a semiconductor device can also be reduced. The manufacturing cost of a semiconductor device can also be reduced.

DETAILED DESCRIPTION OF THE INVENTION

Figure 1A:
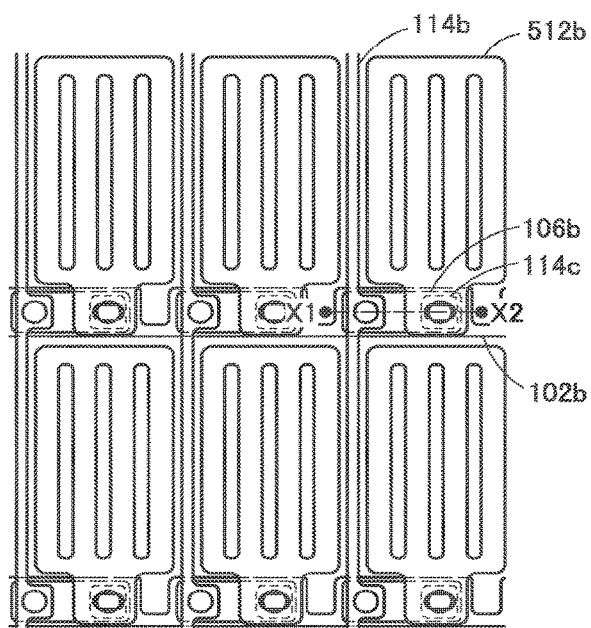
FIGS. 1A to 1C are top views illustrating a semiconductor device.

Embodiments of the present invention are described below in detail with reference to the accompanying drawings. Note that the present invention is not limited to the description below, and it is easily understood by those skilled in the art that modes and details thereof can be modified in various ways. Further, the present invention is not construed as being limited to description of the embodiments. In describing structures of the present invention with reference to the drawings, common reference numerals are used for the same portions in different drawings. Note that the same hatched pattern is applied to similar parts, and the similar parts are not especially denoted by reference numerals in some cases.

Note that the ordinal numbers such as "first" and "second" in this specification and the like are used for convenience and do not denote the order of steps or the stacking order of layers. Therefore, for example, description can be made even when "first" is replaced with "second" or "third", as appropriate. In addition, the ordinal numbers in this specification are not necessarily the same as the ordinal numbers used to specify one embodiment of the present invention.

Note that in this specification and the like, the term such as "over" does not necessarily mean that a component is placed "directly on" another component. For example, the expression "a gate electrode over an insulating layer" can mean a case where there is an additional component between the insulating layer and the gate electrode. The same applies to the term "under". The expression can also mean a case where there is no planar overlap between the insulating layer and the gate electrode (i.e., the insulating layer and the gate electrode do not overlap each other).

In addition, in this specification and the like, terms such as "electrode" and "wiring" do not limit the functions of components. For example, an "electrode" can be used as pert of a "wiring", and the "wiring" can be used as part of the "electrode". The terms such as "electrode" and "wiring" can also mean a combination of a plurality of "electrodes" and "wirings".

Functions of a "source" and a "drain" are sometimes replaced with each other, for example, when a transistor of opposite polarity is used or when the direction of flow of current is changed in circuit operation. Therefore, the terms "source" and "drain" can be replaced with each other in this specification.

The term "electrically connected" includes the case where components are connected through an "object having any electric function". There is no particular limitation on the "object having any electric function" as long as electric signals can be transmitted and received between the components connected through the object. Examples of the "object having any electric function" are an electrode and a wiring.

Note that a "semiconductor" can have characteristics of an "insulator", for example, when the conductivity is sufficiently low. Further, a "semiconductor" and an "insulator" cannot be strictly distinguished from each other in some cases because a border between the "semiconductor" and the "insulator" is not clear. Therefore, a "semiconductor" in this specification can be called an "insulator" in some cases. Similarly, an "insulator" in this specification can be called a "semiconductor" in some cases.

Further, a "semiconductor" can includes characteristics of a "conductor", for example, when the conductivity is sufficiently high. Further, a "semiconductor" and a "conductor" cannot be strictly distinguished from each other in some cases because a border between the "semiconductor" and the "conductor" is not clear. Therefore, a "semiconductor" in this specification can be called a "conductor" in some cases. Similarly, a "conductor" in this specification can be called a "semiconductor" in some cases.

In this specification and the like, the term "parallel" indicates that the angle formed between two straight lines is greater than or equal to −10° and less than or equal to 10°, and accordingly also includes the case where the angle is greater than or equal to −5 and less than or equal to 5°. In addition, the term "perpendicular" indicates that the angle formed between two straight lines ranges from 80° to 100°, and accordingly also includes the case where the angle ranges from 85° to 95°.

In this specification and the like, trigonal and rhombohedral crystal systems are included in a hexagonal crystal system.

(Embodiment 1)

Figure 1B:
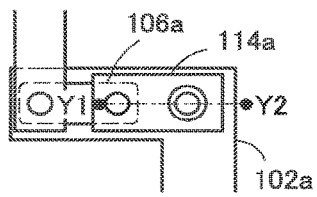
Figure 1C:
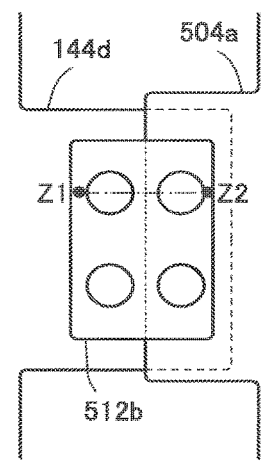

A method for manufacturing a semiconductor device that is one embodiment of the present invention is described with reference to FIGS. 1A to 1C, FIGS. 2A to 2E, FIGS. 3A to 3D, FIGS. 4A to 4F, FIGS. 5A to 5E, FIGS. 6A to 6E, FIGS. 7A to 7E, FIGS. 8A to 8D, FIGS. 9A to 9F, and FIGS. 10A to 10E. FIGS. 1A to 1C are top views illustrating a semiconductor device. FIG. 1A illustrates a portion that can function as a pixel region of a liquid crystal display device. FIGS. 1B and 1C each illustrate a portion that can function as a peripheral portion provided with a driver and the like of the liquid crystal display device. Some components are selectively illustrated for simplification of the drawings; for example, an insulating film 104, an insulating film 108, and the like are not illustrated. FIGS. 2A to 10E each illustrate the cross section X1-X2 taken along the dashed dotted line X1-X2 in FIG. 1A. The cross section X1-X2 corresponds to a cross-sectional structure of part of a region where a transistor is formed. FIGS. 2A to 10E each also illustrate the cross section Y1-Y2 taken along the dashed dotted line Y1-Y2 in FIG. 1B. The cross section Y1-Y2 corresponds to a cross-sectional structure of part of a region where a conductive film under a semiconductor film and a conductive film over the semiconductor film are electrically connected to each other.

<<Manufacturing Method 1>>

Figure 2A:
FIGS. 2A to 2E are cross-sectional views illustrating a method for manufacturing a semiconductor device that is one embodiment of the present invention.
Figure 2B:
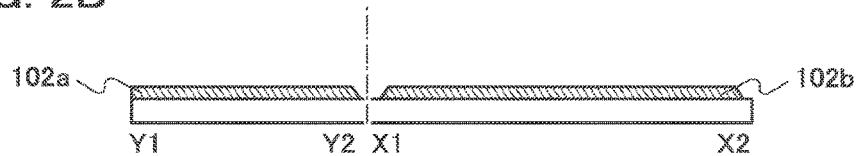
Figure 2C:
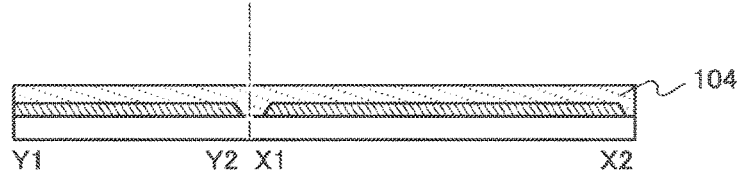
Figure 2D:
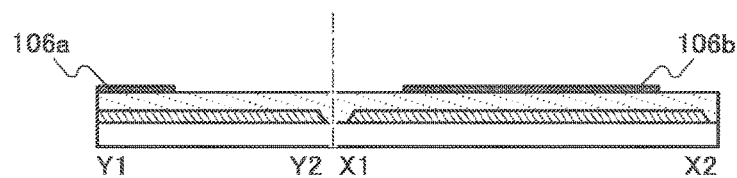
Figure 2E:
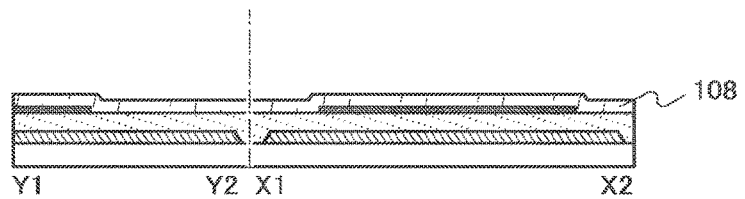
Figure 3A:
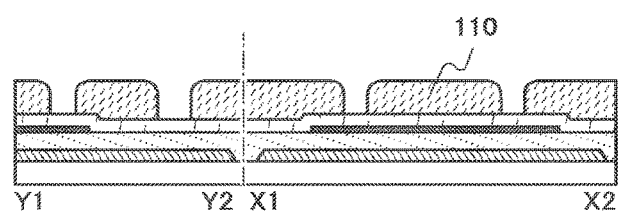
FIGS. 3A to 3D are cross-sectional views illustrating a method for manufacturing a semiconductor device that is one embodiment of the present invention.
Figure 3B:
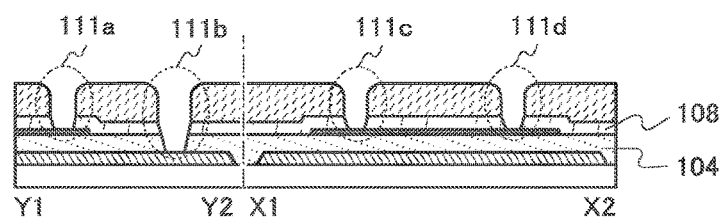
Figure 3C:
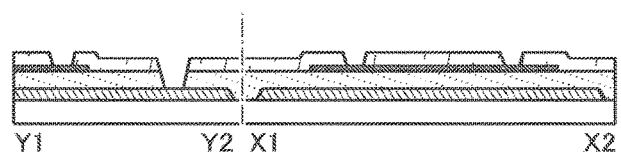
Figure 3D:
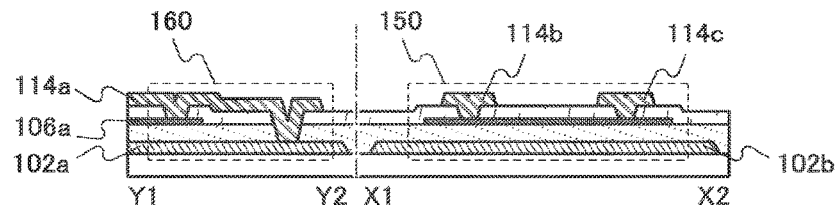

First, a method for forming a transistor 150 and a connection portion 160, which are illustrated in FIG. 3D, is described with reference to FIGS. 2A to 2E and FIGS. 3A to 3D.

<Substrate>

First, a substrate 100 is provided (FIG. 2A). There is no particular limitation on the property of a material and the like of the substrate 100 as long as the material has heat resistance high enough to withstand at least heat treatment performed later. For example, a glass substrate, a ceramic substrate, a quartz substrate, a sapphire substrate, or an yttria-stabilized zirconia (YSZ) substrate may be used as the substrate 100. Alternatively, a single-crystal semiconductor substrate or a polycrystalline semiconductor substrate made of silicon, silicon carbide, or the like, a compound semiconductor substrate made of silicon germanium or the like, an SOI substrate, or the like can be used as the substrate 100.

Alternatively, a semiconductor substrate or an SOT substrate provided with a semiconductor element may be used as the substrate 100. In this case, the transistor 150 is formed over the substrate 100 with an interlayer insulating layer interposed therebetween. The transistor 150 in this case may have a structure in which at least one of a conductive film 102b, a conductive film 114b, and a conductive film 114c is electrically connected to the semiconductor element by a connection electrode embedded in the interlayer insulating layer. Forming the transistor 150 over the semiconductor element with the interlayer insulating layer interposed therebetween can suppress an increase in area due to the formation of the transistor 150.

Alternatively, a flexible substrate such as a plastic substrate may be used as the substrate 100, and the transistor 150 may be provided directly on the flexible substrate. Further alternatively, a separation layer may be provided between the substrate 100 and the transistor 150. The separation layer can be used when pert or the whole of the transistor formed over the separation layer is formed and separated from the substrate 100 and transferred to another substrate. Thus, the transistor 150 can be transferred to a substrate having low heat resistance or a flexible substrate.

<Formation of Conductive Film>

Next, a conductive film is formed over the substrate 100 by a sputtering method, a CVD method, an evaporation method, or the like, and a resist mask is formed over the conductive film by a photolithography process. After that, part of the conductive film is etched using the resist mask to form a conductive film 102a and the conductive film 102b (FIG. 3B). The conductive film 102b can function as a gate electrode in the transistor 150.

The conductive film 102a and the conductive film 102b can be formed using a metal selected from aluminum, chromium, copper, tantalum, titanium, molybdenum, and tungsten, an alloy containing any of these metals as its component, an alloy containing any of these metals in combination, or the like. Further, one or more metals selected from manganese and zirconium may be used.

The conductive film 102a and the conductor film 102b may have a single-layer structure or a layered structure of two or more layers. For example, a two-layer structure in which a film functioning as a barrier film such as a film of a metal selected from tungsten, titanium, and molybdenum or an alloy containing any of the metals as its component is stacked over or under an aluminum film may be employed. Alternatively, a three-layer structure in which the above-described films functioning as barrier films are stacked over and under an aluminum film may be employed. Further alternatively, a two-layer structure in which the above-described film functioning as a barrier film is stacked over or under a copper film may be employed. Still alternatively, a three-layer structure in which the above-described films functioning as barrier films are stacked over and under a copper film may be employed.

By using the aluminum film or the copper film, which has low resistance, for the conductive film 102a and the conductive film 102b, the power consumption of the semiconductor device can be reduced. In addition, by stacking the film functioning as a barrier film, such as a tungsten film, a titanium film, or a molybdenum film, to be in contact with the aluminum film or the copper film, diffusion of aluminum or copper can be suppressed and the reliability of the semiconductor device can be improved.

Further, an In—Ga—Zn-based oxynitride semiconductor film, an In—Sn-based oxynitride semiconductor film, an In—Ga-based oxynitride semiconductor film, an In—Zn-based oxynitride semiconductor film, a Sn-based oxynitride semiconductor film, an In-based oxynitride semiconductor film, or a film of a metal nitride (e.g., InN or ZnN), or the like may be provided between the conductive film 102b and the insulating film 104 described later. These films each have a work function higher than or equal to 5 eV, preferably higher than or equal to 5.5 eV, which is higher than the electron affinity of an oxide semiconductor, thus, the threshold voltage of a transistor can be shifted in the positive direction in the case where an oxide semiconductor is used for a semiconductor film described later, and what is called a normally-off switching element can be obtained. For example, as an In—Ga—Zn-based oxynitride semiconductor film, an In—Ga—Zn-based oxynitride semiconductor film having a higher nitrogen concentration than at least a semiconductor film 106b, specifically an In—Ga—Zn-based oxynitride semiconductor film having a nitrogen concentration higher than or equal to 7 atom %, is used.

<Formation of Insulating Film>

Next, an insulating film 104 is formed over the substrate 100, the conductive film 102a, and the conductive film 102b (FIG. 2C). The insulating film 104 can function as a gate insulating film in the transistor 150.

The insulating film 104 can be formed to have a single-layer structure or a stacked-layer structure using, for example, one or more of a silicon oxide film, a silicon oxynitride film, a silicon nitride oxide film, a silicon nitride film, an aluminum oxide film, a hafnium oxide film, a gallium oxide film, and a Ga—Zn-based metal oxide film.

The insulating film 104 may be formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, so that gate leakage current of the transistor can be reduced.

The insulating film 104 is formed by a sputtering method, a CVD method, an evaporation method, or the like.

In the case where a silicon nitride film is formed as the insulating film 104, it is preferable to use a two-step formation method. First, a first silicon nitride film with a small number of defects is formed by a plasma CVD method in which a mixed gas of silane, nitrogen, and ammonia is used as a source gas. Then, a second silicon nitride film in which the hydrogen concentration is low and hydrogen can be blocked is formed by switching the source gas to a mixed gas of silane and nitrogen. The formation method can form a silicon nitride film with few defects and a blocking property against hydrogen as the insulating film 104.

In the case where a gallium oxide film is formed as the insulating film 104, metal organic chemical vapor deposition (MOCVD) method can be employed.

<Formation of Semiconductor Film>

Next, a semiconductor film is formed over the insulating film 104 by a sputtering method, a CVD method, an evaporation method, or the like, and a resist mask is formed over the semiconductor film by a photolithography process. After that, at least part of the semiconductor film is etched using the resist mask to form a semiconductor film 106a and the semiconductor film 106b (FIG. 2D). The semiconductor film 106b includes a channel region of the transistor 150.

A variety of semiconductor materials can be used for the semiconductor film 106a and the semiconductor film 106b. Specifically, a single layer or a stacked layer of amorphous silicon, microcrystalline silicon, polycrystalline silicon, single-crystal silicon, or the like can be used. In addition, an impurity imparting a conductivity type may be added to part of the semiconductor film or to at least one layer in the case of the stacked layer.

Besides the semiconductor materials given above, an oxide semiconductor can be used. A transistor including an oxide semiconductor has extremely low off-state current in some cases. By using such a transistor, the holding capability of a signal input to a capacitor of each pixel in a liquid crystal display device can be improved, so that the frame rate in, for example, still-image display can be reduced. The reduction in the frame rate leads to a reduction in the power consumption of the display device.

An oxide semiconductor that can be used for the semiconductor film 106a and the semiconductor film 106b is described below.

The oxide semiconductor contains, for example, indium. An oxide semiconductor containing indium has high carrier mobility (electron mobility). An oxide semiconductor preferably contains an element M. Examples of the element M include aluminum, gallium, yttrium, and tin. For example, the element M has high bond energy to oxygen. For example, the element M increases the energy gap of the oxide semiconductor. Further, the oxide semiconductor preferably contains zinc. When containing zinc, the oxide semiconductor easily becomes crystalline. The energy at the top of the valence band (Ev) of the oxide semiconductor can be controlled by, for example, the atomic ratio of zinc, in some cases.

The oxide semiconductor does not necessarily contain indium. The oxide semiconductor may be, for example, a Zn—Sn oxide or a Ga—Sn oxide.

The oxide semiconductor may be an In-M-Zn oxide having any of the following atomic ratios of In to M: the atomic percentage of In is smaller than 50 atomic % and the atomic percentage of M is larger than or equal to 50 atomic %, and the atomic percentage of In is smaller than 25 atomic % and the atomic percentage of M is larger than or equal to 75 atomic %, when summation of In and M is assumed to be 100 atomic %. Further, the oxide semiconductor may be an In-M-Zn oxide having any of the following atomic ratios of In to M: the atomic percentage of In is larger than or equal to 25 atomic % and the atomic percentage of M is smaller than 75 atomic %, and the atomic percentage of In is larger than or equal to 34 atomic % and the atomic percentage of M is smaller than 66 atomic %, when summation of In and M is assumed to be 100 atomic %.

The oxide semiconductor has a large energy gap. The energy gap of the oxide semiconductor is greater than or equal to 2.7 eV and less than or equal to 4.9 eV, preferably greater than or equal to 3 eV and less than or equal to 4.7 eV, more preferably greater than or equal to 3.2 eV and less than or equal to 4.4 eV.

In order to obtain stable electrical characteristics of a transistor, it is effective to reduce the concentration of impurities in the oxide semiconductor so that the oxide semiconductor is highly purified to be intrinsic. In the oxide semiconductor, a light element, a semimetal element, a metal element, and the like (lower than 1 atomic %) other than main components serve as impurities. For example, hydrogen, lithium, carbon, nitrogen, fluorine, sodium, silicon, chlorine, potassium, calcium, titanium, iron, nickel, copper, germanium, strontium, zirconium, and hafnium might be impurities in the oxide semiconductor. Thus, it is preferable to reduce the concoatration of impurities in a film adjacent to the oxide semiconductor.

For example, in some cases, silicon in an oxide semiconductor forms impurity states. Further, in some cases, silicon at the surface of an oxide semiconductor forms impurity states. Thus, the concentration of silicon in an oxide semiconductor or at the surface of an oxide semiconductor, which is measured by secondary ion mass spectrometry (SIMS), is preferably lower than $1\times10^{19}$ atoms/cm$^3$, more preferably lower than $5\times10^{18}$ atoms/cm$^3$, still more preferably lower than $2\times10^{18}$ atoms/cm$^3$.

Further, in some cases, hydrogen in an oxide semiconductor forms impurity states, whereby carrier density is increased. Thus, the concentration of hydrogen in the oxide semiconductor, which is measured by SIMS, is lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, still more preferably lower than or equal to $5\times10^{18}$ atoms/cm$^3$. Further, in some cases, nitrogen in an oxide semiconductor forms impurity levels, whereby carrier density is increased. Thus, the concentration of nitrogen in the oxide semiconductor, which is measured by SIMS, is lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

An oxide semiconductor film may include a CAAC-OS film. First, the CAAC-OS film is described.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in the direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in the direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in the direction parallel to a normal vector of a formation surface or a normal vector of a top surface. Thus, for example, in the case where the shape of the CAAC-OS film is changed by etching or the like, the c-axis might not be necessarily parallel to a normal vector of a formation surface or a normal vector of a top surface of the CAAC-OS film.

The degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. For example, oxygen vacancies in the oxide semiconductor film serve as carrier traps or serve as carrier generation sources in some cases when hydrogen is captured therein.

The state in which the impurity concentration is low and the density of defect states is low (the number of oxygen vacancies is small) is referred to as a highly purified intrinsic state or a substantially highly purified intrinsic state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has small variations in electrical characteristics and high reliability. Electric charge trapped by the carrier traps in the oxide semiconductor film takes a long time to be released, and might behave like fixed electric charge. Thus, the transistor that includes the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a microcrystalline oxide semiconductor film is described.

In an image obtained with the TEM, crystal parts cannot be found clearly in the microcrystalline oxide semiconductor in some cases. In most cases, the size of a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In an image of the nc-OS obtained with a TEM, for example, a crystal grain cannot be observed clearly in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Further, there is no regularity of crystal orientation between different crystal parts in the nc-OS film; thus, the orientation is not observed in the whole film. Accordingly, in some cases, the nc-OS film cannot be distinguished from an amorphous oxide semiconductor depending on an analysis method. For example, when the nc-OS film is subjected to structural analysis by an out-of-plane method with an XRD apparatus using an X-ray having a diameter larger than that of a crystal part, a peak which shows a crystal plane does not appear. Further, a halo pattern is shown in an electron diffraction pattern (also referred to as a selected-area electron diffraction area) of the nc-OS film obtained by using an electron beam having a diameter (e.g., larger than or equal to 50 nm) larger than that of a crystal part. Meanwhile, spots are shown in a nanobeam electron diffraction pattern of the nc-OS film obtained by using an electron beam having a diameter (e.g., larger than or equal to 1 nm and smaller than or equal to 30 nm) close to, or smaller than or equal to that of a crystal part. Further, in a nanobeam electron diffraction pattern of the nc-OS film, regions with high luminance in a circular (ring) pattern are shown in some cases. Also in a nanobeam electron diffraction pattern of the nc-OS film, a plurality of spots are shown in a ring-like region in some cases.

Since the nc-OS film is an oxide semiconductor film having more regularity than the amorphous oxide semiconductor film, the nc-OS film has a lower density of defect states than the amorphous oxide semiconductor film. However, there is no regularity of crystal orientation between different crystal parts in the nc-OS film; hence, the nc-OS film has a higher density of defect states than the CAAC-OS film.

Note that an oxide semiconductor film may be a stacked film including two or more kinds of, for example, an amorphous oxide semiconductor film, a microcrystalline oxide semiconductor film, and a CAAC-OS film.

For example, a multilayer film in which an oxide semiconductor layer (S1) and an oxide semiconductor layer (S2) are formed in this order may be used.

In this case, for example, the energy (Ec) at the bottom of the conduction band of the oxide semiconductor layer (S2) is set to be higher than that of the oxide semiconductor layer (S1). Specifically, for the oxide semiconductor layer (S2), an oxide semiconductor having lower electron affinity than the oxide semiconductor layer (S1) by greater than or equal to 0.07 eV and less than or equal to 1.3 eV, preferably greater than or equal to 0.1 eV and less than or equal to 0.7 eV, more preferably greater than or equal to 0.15 eV and less than or equal to 0.4 eV is used. Note that the electron affinity refers to an energy gap between the vacuum level and the bottom of the conduction band.

Alternatively, for example, the energy gap of the oxide semiconductor layer (S2) is set to be larger than that of the oxide semiconductor layer (S1). The energy gap can be obtained by, for example, an optical method. Specifically, for the oxide semiconductor layer (S2), an oxide semiconductor having a larger energy gap than the oxide semiconductor layer (S1) by greater than or equal to 0.1 eV and less than or equal to 1.2 eV, preferably greater than or equal to 0.2 eV and less than or equal to 0.8 eV is used.

Alternatively, the oxide semiconductor may be, for example, a multilayer film in which the oxide semiconductor layer (S1), the oxide semiconductor layer (S2), and an oxide semiconductor layer (S3) are formed in this order.

For example, the energy (Ec) at the bottom of the conduction band of the oxide semiconductor layer (S2) is set to be lower than that of the oxide semiconductor layer (S1) and the oxide semiconductor layer (S3). Specifically, for the oxide semiconductor layer (S2), an oxide semiconductor having higher electron affinity than the oxide semiconductor layer (S1) and the oxide semiconductor film (S3) by greater than or equal to 0.07 eV and less than or equal to 1.3 eV, preferably greater than or equal to 0.1 eV and less than or equal to 0.7 eV, more preferably greater than or equal to 0.15 eV and less than or equal to 0.4 eV is used.

Alternatively, for example, the energy gap of the oxide semiconductor layer (S2) may be smaller than that of each of the oxide semiconductor layers (S1) and (S3). Specifically, for the oxide semiconductor layer (S2), an oxide semiconductor having smaller energy gap than the oxide semiconductor layers (S1) and (S3) by greater than or equal to 0.1 eV and smaller than or equal to 1.2 eV or by greater than or equal to 0.2 eV and smaller than or equal to 0.8 eV is used.

For example, to increase the on-state current of the transistor, the thickness of the oxide semiconductor layer (S3) is preferably as low as possible. For example, the thickness of the oxide semiconductor layer (S3) is less than 10 nm, preferably less than or equal to 5 nm, more preferably less than or equal to 3 nm. Meanwhile, the oxide semiconductor layer (S3) blocks entry of elements (e.g., silicon) contained in the insulating film 104 to the oxide semiconductor layer (S2) having a high current density. Thus, the oxide semiconductor layer (S3) preferably has a certain thickness. The thickness of the oxide semiconductor layer (S3) is, for example, greater than or equal to 0.3 nm, preferably greater than or equal to 1 nm, more preferably greater than or equal to 2 nm.

The thickness of the oxide semiconductor layer (S1) is preferably larger than that of the oxide semiconductor layer (S2), and the thickness of the oxide semiconductor layer (S2) may be larger than that of the oxide semiconductor layer (S3). Specifically, the thickness of the oxide semiconductor layer (S1) is greater than or equal to 20 nm, preferably greater than or equal to 30 nm, mare preferably greater than or equal to 40 nm, still more preferably greater than or equal to 60 nm. With the oxide semiconductor layer (S1) having the above thickness, the interface between the insulating film and the oxide semiconductor layer (S1) can be separated from the oxide semiconductor layer (S2) with high current density to have a distance greater than or equal to 20 nm, preferably greater than or equal to 30 nm, more preferably greater than or equal to 40 nm, still more preferably greater than or equal to 60 nm. To prevent the productivity of the semiconductor device from being lowered, the thickness of the oxide semiconductor layer (S1) is less than or equal to 200 nm, preferably less than or equal to 120 nm, more preferably less than or equal to 80 nm. The thickness of the oxide semiconductor layer (S2) is greater than or equal to 3 nm and less than or equal to 100 nm, preferably greater than or equal to 3 nm and less than or equal to 80 nm, more preferably greater than or equal to 3 nm and less than or equal to 50 nm.

Next, a method for forming the oxide semiconductor film is described. The oxide semiconductor film may be formed by a sputtering method, a CVD method, an MBE method, an ALD method, or a PLD method.

When In-M-Zn oxide is formed by a sputtering method for the oxide semiconductor film to be a semiconductor film 106, the atomic ratio of the target may be as follows: In:M:Z=3:1:1, 3:1:2, 3:1:4, 1:1:0.5, 1:1:1, 1:1:2, 1:3:1, 1:3:2, 1:3:4, 1:3:6, 1:6:2, 1:6:4, 1:6:6, 1:6:8, 1:6:10, 1:9:2, 1:9:4, 1:9:6, 1:9:8, 1:9:10, or the like. Examples of the element M include aluminum, gallium, yttrium, and tin.

When the oxide semiconductor film is formed by a sputtering method, it is formed under an atmosphere containing oxygen. The proportion of oxygen in the atmosphere is, for example, larger than or equal to 10 volume %, preferably larger than or equal to 20 volume %, more preferably larger than or equal to 50 volume %, still more preferably larger than or equal to 80 volume %. In particular, the proportion of oxygen in the atmosphere is preferably 100 volume %. When the proportion of oxygen in the atmosphere is 100 volume %, the concentration of impurities (e.g., a rare gas) contained in the oxide semiconductor film to be the semiconductor film 106 can be reduced.

In the case where the oxide semiconductor film to be the semiconductor film 106 is formed by a sputtering method, a film having an atomic ratio deviated from the atomic ratio of the target is formed in some cases. For example, when zinc is formed under an atmosphere containing oxygen, the atomic ratio of zinc in the formed film is easily smaller than that in the target in some cases. Specifically, the atomic percentage of zinc in the film is higher than or equal to approximately 40% and lower than or equal to approximately 90% of that of zinc in the target in some cases. Further, for example, when indium is formed under an atmosphere containing oxygen, the atomic ratio of indium in the formed film is easily smaller than that in the target in some cases.

First heat treatment is preferably performed after the oxide semiconductor film to be the semiconductor film 106 is formed. The first heat treatment may be performed at higher than or equal to 70° C. and lower than or equal to 450° C., preferably higher than or equal to 100° C. and lower than or equal to 300° C., more preferably higher than or equal to 150° C. and lower than or equal to 250° C. The first heat treatment is performed in an inert gas atmosphere or an atmosphere containing an oxidizing gas at 10 ppm or more, 1 volume % or more, or 10 volume % or mom. The first heat treatment may be performed under a reduced pressure. Alternatively, the first heat treatment may be performed in such a manner that heat treatment is performed in an inert gas atmosphere, and then another heat treatment is performed in an atmosphere containing an oxidizing gas at 10 ppm or more, 1 volume % or more, or 10 volume % or more in order to compensate desorbed oxygen. The first heat treatment can remove impurities such as hydrogen and water from the oxide semiconductor film to be the oxide semiconductor film 106. In addition, the first heat treatment can highly purify the oxide semiconductor film to be the oxide semiconductor film 106.

<Formation of Insulating Film>

Next, an insulating film 108 is formed over the insulating film 104, the semiconductor film 106a, and the semiconductor film 106b (FIG. 2E). The insulating film 108 functions as a film that protects the channel region in the semiconductor film 106b in the transistor 150.

The insulating film 108 can be formed using a material, a structure, and a method similar to those of the insulating film 104.

In the case where the insulating film 104 has a layered structure of films formed of different materials, the same material can be used for an upper layer of the insulating film 104 and the insulating film 108. When the same material is used for the upper layer of the insulating film 104 and the insulating film 108, the upper layer of the insulating film 104 and the insulating film 108 can be etched at the same time in etching of the insulating film 104 and the insulating film 108 in a later step. After that, a remaining lower layer of the insulating film 104 is etched. Thus, an opening in which the taper angle of the upper layer of the insulating film 104 and the insulating film 108 is different from the taper angle of the lower layer of the insulating film 104 can be formed. The opening having the different taper angles can prevent disconnection of a conductive film formed in the opening.

<Formation of Mask and Etching of Insulating Film>

Next, a resist mask 110 is formed over the insulating film 108 by a photolithography process (FIG. 3A).

Next, portions of the insulating film 104 and the insulating film 108 that the resist mask 110 does not overlap are removed by etching to form an opening 111a, an opening 111b, an opening 111c, and an opening 111d (FIG. 3B).

As illustrated in FIG. 3B, the openings 111a, 111c, and 111d are formed in such a manner that portions of the insulating film 108 that overlap the semiconductor film 106a and 106b and that the resist mask 110 does not overlap are removed.

The opening 111b is formed in such a manner that portions of the insulating film 104 and the insulating film 108 that overlaps the conductive film 102a and overlaps neither the semiconductor film 106a nor the semiconductor film 106b and that the resist mask 110 does not overlap are removed.

Then, the resist mask 110 is removed (see FIG. 3C).

<Formation of Conductive Film>

Next, a conductive film is formed over the insulating film 108, the semiconductor film 106a, the semiconductor film 106b, and the conductive film 102a, and a resist mask is formed over the conductive film by a photolithography process. After that, part of the conductive film is etched using the resist mask to form a conductive film 114a, a conductive film 114b, and a conductive film 114c (FIG. 3D).

The conductive film 114a is electrically connected to the conductive film 102a and the semiconductor film 106a. In addition, the conductive film 114b and the conductive film 114c are electrically connected to the semiconductor film 106b.

The conductive film 114a can function as a wiring that electrically connects the conductive film 102a and the semiconductor film 106a. The conductive film 114b can function as a source electrode in the transistor 150, and the conductive film 114c can function as a drain electrode in the transistor 150.

The conductive films 114a, 114b, and 114c can be formed using a material, a structure, and a method similar to those of the conductive films 102a and 102b.

Though the above-described steps, the transistor 150 and the connection portion 160 can be formed.

As described above, in the manufacturing method 1, at the same time as forming the openings in the portions of the insulating film 108 that overlap the semiconductor films, the opening is formed in the insulating film 104 as well as in the insulating film 108 in the portion that does not overlap the semiconductor films. This step enables the number of masks and the number of photolithography processes to be reduced compared to the case where openings are formed separately in the insulating film 108 and the insulating film 104. Thus, the manufacturing time and manufacturing cost of the semiconductor device can be reduced.

<<Manufacturing Method 2>>

Figure 4A:
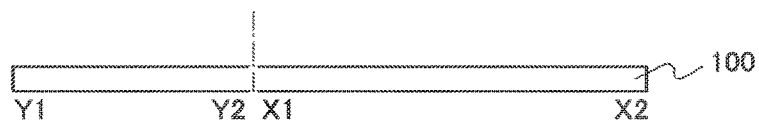
FIGS. 4A to 4F are cross-sectional views illustrating a method for manufacturing a semiconductor device that is one embodiment of the present invention.
Figure 4B:
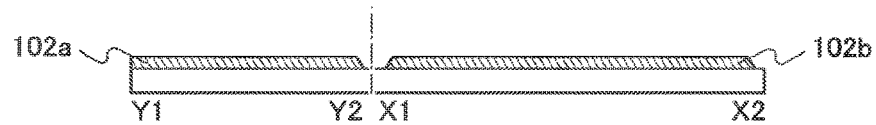
Figure 4C:
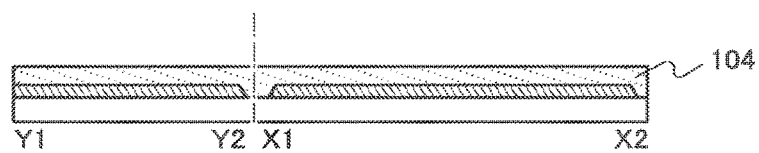
Figure 4D:
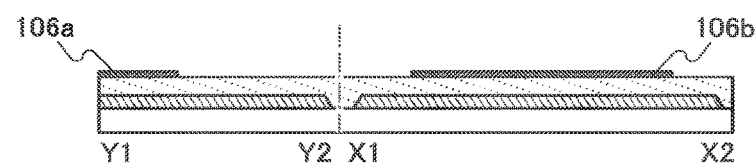
Figure 4E:
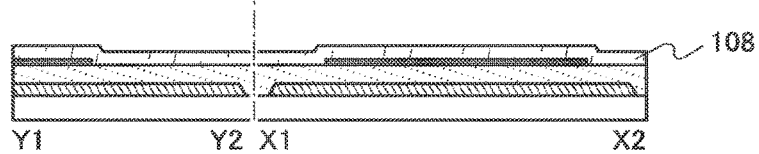
Figure 4F:
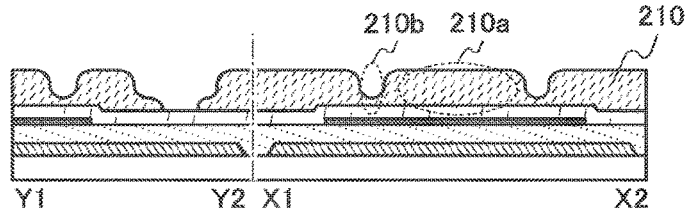
Figure 5A:
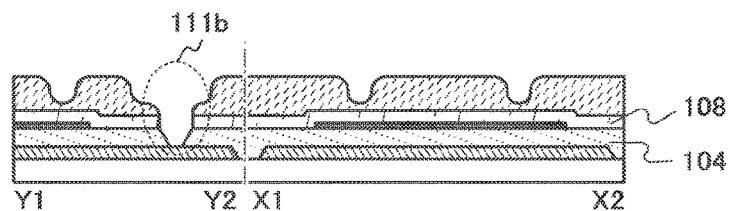
FIGS. 5A to 5E are cross-sectional views illustrating a method for manufacturing a semiconductor device that is one embodiment of the present invention.
Figure 5B:
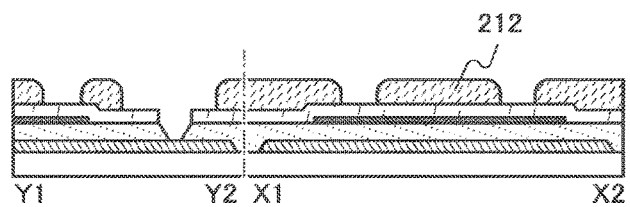
Figure 5C:
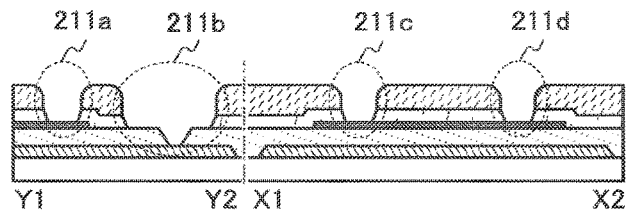
Figure 5D:
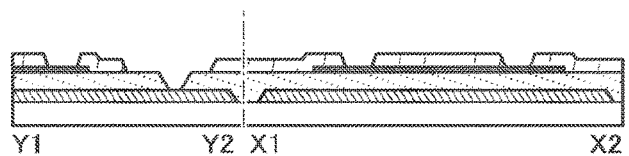
Figure 5E:
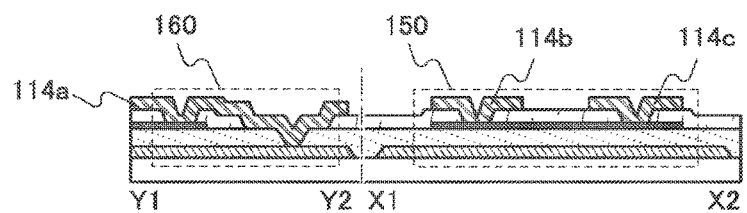

A method for forming the transistor 150 and the connection portion 160, which are illustrated in FIG. 5E, is described with reference to FIGS. 4A to 4F and FIGS. 5A to 5E.

The substrate 100, the conductive films 102a and 102b, the insulating film 104, the semiconductor films 106a and 106b, and the insulating film 108, which are illustrated in FIGS. 4A to 4E, can be formed using materials, structures, and methods similar to those in the manufacturing method 1.

<Formation of Mask and Etching of Insulating Film>

A resist mask 210 is formed over the insulating film 108 by a photolithography process (FIG. 4F). As illustrated in FIG. 4F, the resist mask 210 includes regions with different thicknesses: a region 210a and a region 210b with a thickness smaller than that of the region 210a. At least part of the region 210b overlaps the semiconductor film 106a and the semiconductor film 106b.

The resist mask 210 is formed by a photolithography process using a multi-tone mask (a half-tone photomask or a gray-tone photomask).

Next, portions of the insulating film 104 and the insulating film 108 that overlap the conductive film 102a and that the resist mask 210 does not overlap are removed by etching to form the opening 111b (FIG. 5A).

Next, ashing is performed on the resist mask 210. The ashing reduces the area (the volume in three dimensions) and thickness of the resist mask 210. Thus, part of the resist mask 210 that is in the region 210b and has a small thickness is removed to form a resist mask 212 (FIG. 5B). In other words, the part of the resist mask 210 that is in the region 210b is removed by making the resist mask 210 recede, whereby the resist mask 212 is formed.

The ashing can be performed with, for example, oxygen plasma.

Next, portions of the insulating film 108 that the resist mask 212 does not overlap are removed by etching to form an opening 211a, an opening 211b, an opening 211c, and an opening 211d (FIG. 5C).

As illustrated in FIG. 5C, the openings 211a, 211c, and 211d are formed in such a manner that portions of the insulating film 108 that overlap the semiconductor films 106a and 106b and that the resist mask 212 does not overlap are removed.

The opening 211b is formed in such a manner that a portion of the insulating film 108 that overlaps neither the semiconductor film 106a nor the semiconductor film 106b and that the resist mask 212 does not overlap is removed. As illustrated in FIG. 5C, the opening 211b is formed in such a manner that part of the insulating film 108 that is in the vicinity of the opening 111b is removed to enlarge the opening in the insulating film 108. This can prevent disconnection of a conductive film to be formed over and in the opening 211b in a later step.

Then, the resist mask 212 is removed (see FIG. 5D).

<Formation of Conductive Film>

Next, a conductive film is formed over the insulating film 108, the semiconductor film 106a, the semiconductor film 106b, and the conductive film 102a, and a resist mask is formed over the conductive film by a photolithography process. After that, part of the conductive film is etched using the resist mask to form the conductive films 114a, 114b, and 114c (FIG. 5E).

The conductive films 114a, 114b, and 114c can be formed using a material, a structure, and a method similar to those in the manufacturing method 1.

Through the above-described steps, the transistor 150 and the connection portion 160 can be formed.

In the manufacturing method 2, as described above, the use of the multi-tone mask enables the openings 211a, 211b, 211c, and 211d to be formed using one mask. In addition, in the opening 211b, an opening in the insulating film 108 can be larger than an opening in the insulating film 104, which can prevent disconnection of the conductive him 114a.

The above-described steps can reduce the number of masks and the number of photolithography processes. Thus, the manufacturing time and manufacturing cost of the semiconductor device can be reduced. In addition, the yield and reliability of the semiconductor device can be improved.

<<Manufacturing Method 3>>

Figure 6A:
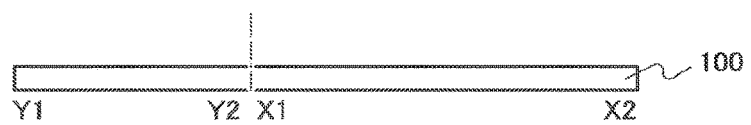
FIGS. 6A to 6E are cross-sectional views illustrating a method for manufacturing a semiconductor device that is one embodiment of the present invention.
Figure 6B:
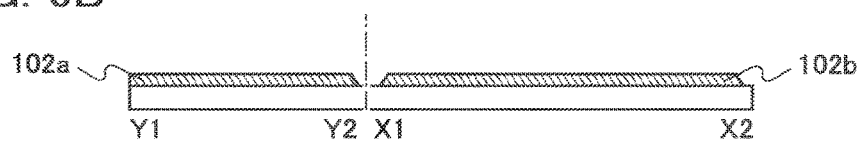
Figure 6C:
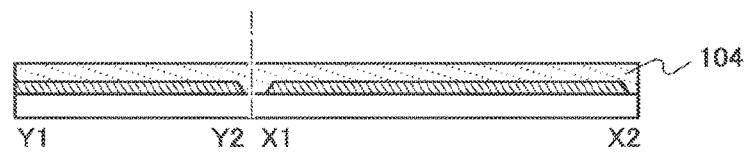
Figure 6D:
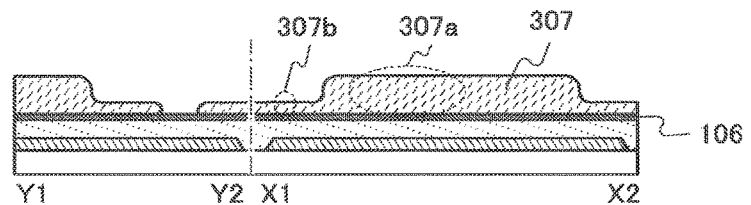
Figure 6E:
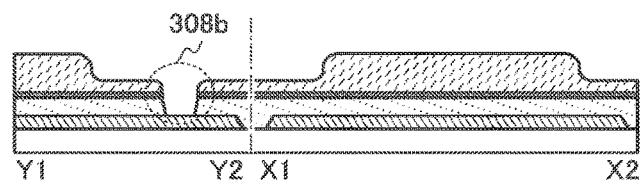
Figure 7A:
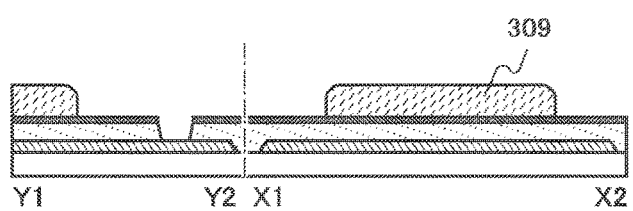
FIGS. 7A to 7E are cross-sectional views illustrating a method for manufacturing a semiconductor device that is one embodiment of the present invention.
Figure 7B:
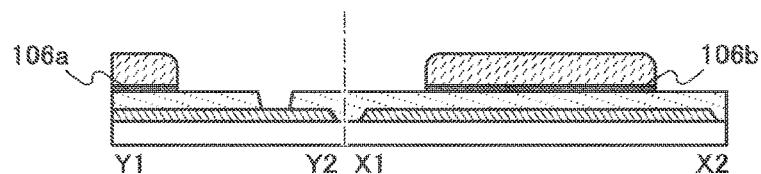
Figure 7C:
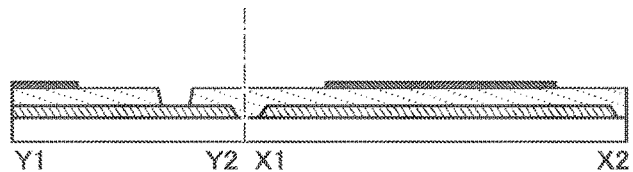
Figure 7D:
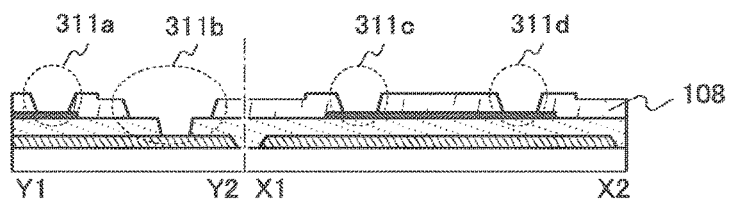
Figure 7E:
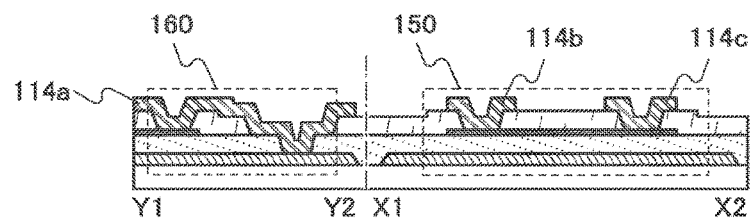

A method for forming the transistor 150 and the connection portion 160, which are illustrated in FIG. 7E, is described with reference to FIGS. 6A to 6E and FIGS. 7A to 7E.

The substrate 100, the conductive films 102a and 102b, and the insulating film 104, which are illustrated in FIGS. 6A to 6C, can be formed using materials, structures, and methods similar to those in the manufacturing method 1.

<Formation of Semiconductor Film>

A semiconductor film 106 is formed over the insulating film 104. The semiconductor film 106 can be formed using a material, a structure, and a method similar to those in the manufacturing method 1.

<Formation of Mask and Etching of Insulating Film and Semiconductor Film>

A resist mask 307 is formed over the semiconductor film 106 by a photolithography process (FIG. 6D). As illustrated in FIG. 61D, the resist mask 307 includes regions with different thicknesses: a region 307a and a region 307b with a thickness smaller than that of the region 307a. At least part of the region 307b overlaps the semiconductor film 106.

The resist mask 307 is formed by a photolithography process using a multi-tone mask (a half-tone photomask or a gray-tone photomask).

Next, portions of the insulating film 104 and the semiconductor film 106 that overlap the conductive film 102a and that the resist mask 307 does not overlap are removed by etching to form an opening 308b (FIG. 6E).

Next, ashing is performed on the resist mask 307. The ashing reduces the area (the volume in three dimensions) of the resist mask 307. Thus, part of the resist mask 307 that is in the region 307b and has a small thickness is removed to form a resist mask 309 (FIG. 7A). In other words, the part of the resist mask 307 that is in the region 307b is removed by making the resist mask 307 recede, whereby the resist mask 309 is formed.

The ashing can be performed with, for example, oxygen plasma.

Next, a portion of the semiconductor film 106 that the resist mask 309 does not overlap is removed by etching to form the semiconductor film 106a and the semiconductor film 106b (FIG. 7B). The semiconductor film 106b can function as a semiconductor film including a channel region of the transistor 150.

Then, the resist mask 309 is removed (FIG. 7C).

<Formation of Insulating Film>

Next, an insulating film is formed over the insulating film 104, the semiconductor film 106a, and the semiconductor film 106b, and a resist mask is formed over the insulating film by a photolithography process. Then, part of the insulating film is etched using the resist mask to form the insulating film 108 that has an opening 311a, an opening 311b, an opening 311c, and an opening 311d (FIG. 7D).

As illustrated in FIG. 7D, the openings 311a, 311c, and 311d are formed in portions that overlap the semiconductor film 106a and the semiconductor film 106b.

The opening 311b is formed in such a manner that a portion of the insulating film that overlaps neither the semiconductor film 106a nor the semiconductor film 106b is removed. Note that as illustrated in FIG. 7D, the opening 311b is formed in a portion overlapping the opening 308b. In addition, in the opening 311b, an opening in the insulating film 108 can be larger than an opening in the insulating film 104. This can prevent disconnection of a conductive film to be formed over and in the opening 311b in a later step.

The insulating film 108 functions as a film that protects the channel region in the semiconductor film 106b in the transistor 150 and can be formed using a material, a structure, and a method similar to those in the manufacturing method 1.

<Formation of Conductive Film>

Next, a conductive film is formed over the insulating film 108, the semiconductor film 106a, the semiconductor film 106b, and the conductive film 102a, and a resist mask is formed over the conductive film by a photolithography process. After that, part of the conductive film is etched using the resist mask to form the conductive films 114a, 114b, and 114c (FIG. 7E).

The conductive films 114a, 114b, and 114c can be formed using a material, a structure, and a method similar to those in the manufacturing method 1.

Through the above-described steps, the transistor 150 and the connection portion 160 can be formed.

In the manufacturing method 3, as described above, the use of the half-tone photomask enables the opening in the insulating film 104 and the semiconductor films 106*a* and 106*b* to be formed using one mask. In addition, in the opening 311*b*, the opening in the insulating film 108 can be larger than the opening in the insulating film 104, which can prevent disconnection of the conductive film 114*a*.

The above-described steps can reduce the number of masks and the number of photolithography processes. Thus, the manufacturing time and manufacturing cost of the semiconductor device can be reduced. In addition, the yield and reliability of the semiconductor device can be improved.

<Variations on Opening>

Figure 8A:
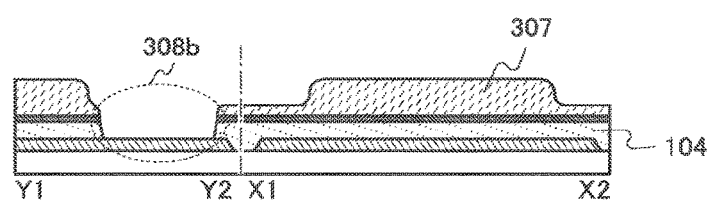
FIGS. 8A to 8D are cross-sectional views illustrating a method for manufacturing a semiconductor device that is one embodiment of the present invention.
Figure 8B:
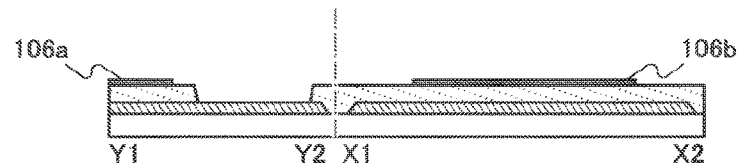
Figure 8C:
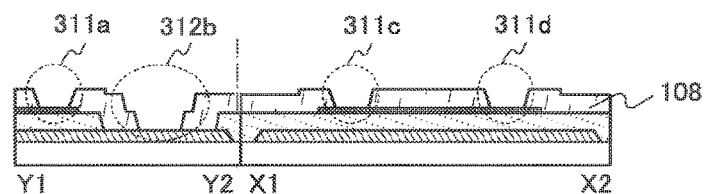
Figure 8D:
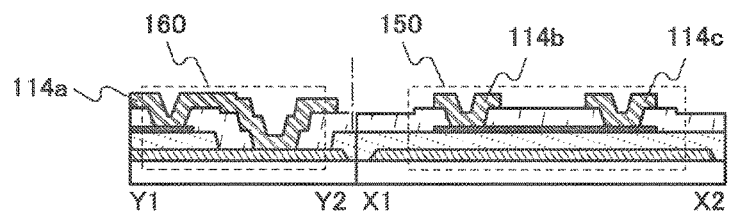
Figure 9A:
FIGS. 9A to 9F are cross-sectional views illustrating a method for manufacturing a semiconductor device that is one embodiment of the present invention.
Figure 9B:
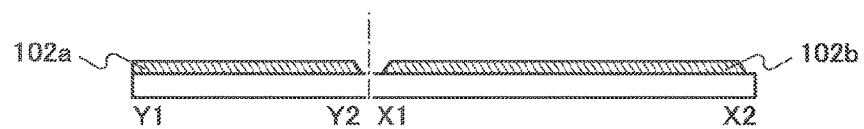
Figure 9C:
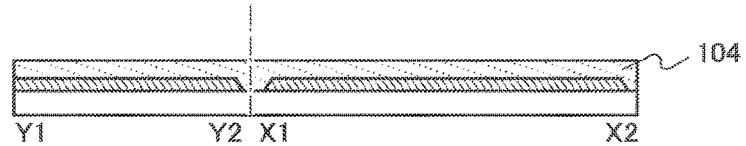
Figure 9D:
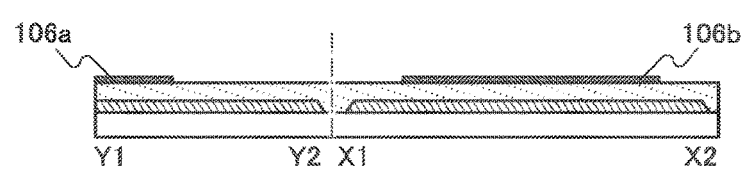
Figure 9E:
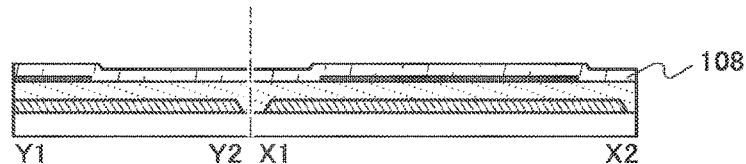
Figure 9F:
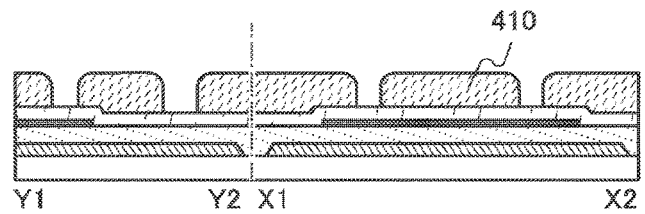

Note that the connection portion 160 illustrated in FIG. 8D, which has a different shape from the connection portion 160 illustrated in FIG. 7E, can be formed by changing the shape of the resist mask 307.

First, the resist mask 307 that has a shape illustrated in FIG. 8A (e.g., a shape in which an opening larger than the opening illustrated in FIG. 6E is provided) is formed to form the opening 308*b* (FIG. 8A).

After that, the semiconductor film 106*a* and the semiconductor film 106*b* are formed by steps similar to those illustrated in FIGS. 7A to 7C (FIG. 8B).

Next, an insulating film is formed over the insulating film 104, the semiconductor film 106*a*, and the semiconductor film 106*b*, and a resist mask is formed over the insulating film by a photolithography process. Then, part of the insulating film is etched using the resist mask to form the insulating film 108 that has the openings 311*a*, 311*c*, and 311*d* and an opening 312*b*. In this case, the opening 312*b* in the insulating film 108 is formed so as to be smaller than the opening 308*b* in the insulating film 104.

Through the above-described steps, the connection portion 160 illustrated in FIG. 8D can be formed.

Even the above-described steps enable the opening in the insulating film 104 and the semiconductor films 106*a* and 106*b* to be formed using one mask and disconnection of the conductive film 114*a* to be prevented. Thus, the number of masks, the number of photolithography processes, and the manufacturing time and manufacturing cost of the semiconductor device can be reduced. In addition, the yield and reliability of the semiconductor device can be improved.

<<Manufacturing Method 4>>

Figure 10A:
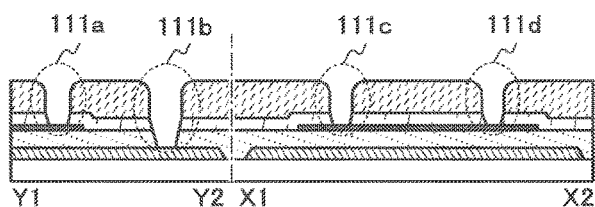
FIGS. 10A to 10E are cross-sectional views illustrating a method for manufacturing a semiconductor device that is one embodiment of the present invention.
Figure 10B:
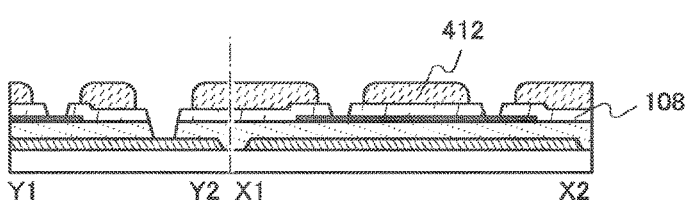
Figure 10C:
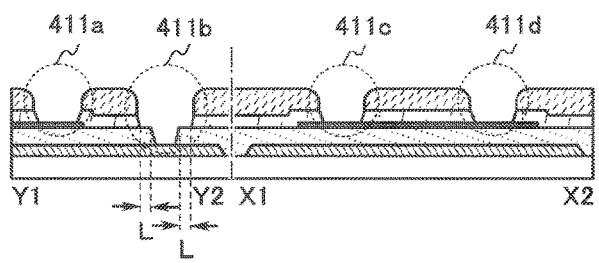
Figure 10D:
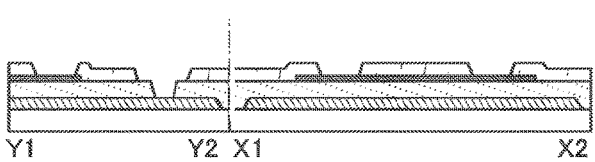
Figure 10E:
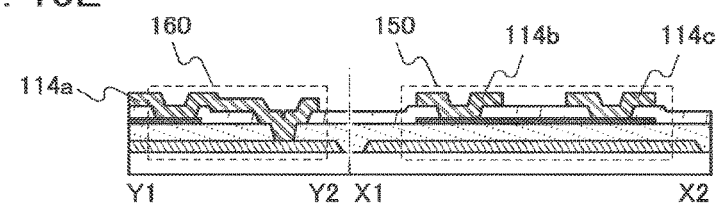

A method for forming the transistor 150 and the connection portion 160, which are illustrated in FIG. 10E, is described with reference to FIGS. 9A to 9F and FIGS. 10A to 10E.

The substrate 100, the conductive films 102*a* and 102*b*, the insulating film 104, the semiconductor films 106*a* and 106*b*, the insulating film 108, and the openings 111*a*, 111*b*, 111*c*, and 111*d*, which are illustrated in FIGS. 9A to 9F and FIG. 10A, can be formed using materials, structures, and methods similar to those in the manufacturing method 1.

<Ashing of Mask>

The openings 111*a*, 111*b*, 111*c*, and 111*d* are formed using the resist mask 110 as illustrated in FIG. 10A, and then ashing is performed on the resist mask 110. The ashing can be performed with, for example, oxygen plasma.

The ashing reduces the area (the volume in three dimensions) and thickness of the resist mask 110 to form a resist mask 412 (FIG. 10B). As a result, parts of the insulating film 108 that the resist mask 412 does not overlap are formed. In other words, parts of the insulating film 108 are exposed by making the resist mask 110 recede.

Next, the portions of the insulating film 108 that the resist mask 412 does not overlap are removed by etching to form an opening 411*a*, an opening 411*b*, an opening 411*c*, and an opening 411*d* (FIG. 10C).

As illustrated in FIG. 10C, the openings 411*a*, 411*c*, and 411*d* are formed in portions that overlap the semiconductor film 106*a* and the semiconductor film 106*b*.

The opening 411*b* is formed in such a manner that a portion of the insulating film that overlaps the conductive film 102*a* and overlaps neither the semiconductor film 106*a* nor the semiconductor film 106*b* is removed. As illustrated in FIG. 10C, the opening 411*b* is formed in such a manner that part of the insulating film 108 that is in the vicinity of the opening 111*b* is removed to enlarge the opening in the insulating film 108. This can prevent disconnection of a conductive film to be formed over and in the opening 411*b* in a later step.

The resist mask 412 is formed by ashing the resist mask 110. Thus, the differences in size between the resist mask 110 and the resist mask 412, that is, the widths of parts of the insulating film 108 that are not covered with the resist mask 412 are substantially equal.

Thus, the widths of steps formed by the insulating film 104 and the insulating film 108 in the opening 411*b*, that is, Ls in FIG. 10C are substantially equal in the entire periphery of the opening 411*b*.

Then, the resist mask 412 is removed (see FIG. 10D).

<Formation of Comductive Film>

Next, a conductive film is formed over the insulating film 108, the semiconductor film 106*a*, the semiconductor film 106*b*, and the conductive film 102*a*, and a resist mask is formed over the conductive film by a photolithography process. After that, part of the conductive film is etched using the resist mask to form the conductive films 114*a*, 114*b*, and 114*c* (FIG. 10E).

The conductive films 114*a*, 114*b*, and 114*c* can be formed using a material, a structure, and a method similar to those in the manufacturing method 1.

Through the above-described steps, the transistor 150 and the connection portion 160 can be formed.

As described above, in the manufacturing method 4, at the same time as forming the openings in the portions of the insulating film 108 that overlap the semiconductor films, the opening is formed in the insulating film 104 as well as in the insulating film 108 in the portion that does not overlap the semiconductor films. This step enables the number of masks and the number of photolithography processes to be reduced compared to the case where openings are formed separately in the insulating film 108 and the insulating film 104. In addition, the ashing performed on the resist mask 110 enables the opening in the insulating film 108 to be larger than the opening in the insulating film 104 in the opening 411*b*, which can prevent disconnection of the conductive film 114*a*.

The above-described steps can reduce the number of masks and the number of photolithography processes. Thus, the manufacturing time and manufacturing cost of the semiconductor device can be reduced. In addition, the yield and reliability of the semiconductor device can be improved.

(Embodiment 2)

A method for manufacturing a semiconductor device that is one embodiment of the present invention is described with reference to FIGS. 1A to 1C, FIGS. 11A to 11E, and FIGS. 12A to 12E. FIGS. 1A to 1C are top views illustrating the semiconductor device as described above. FIGS. 11A to 12E each illustrate the cross section X1-X2 taken along the dashed dotted line X1-X2 in FIG. 1A. The cross section X1-X2 corresponds to a cross-sectional structure of part of a region where a transistor and a conductive film provided over the transistor are electrically connected to each other. FIGS. 11A to 12E each also illustrate the cross section Y1-Y2 taken along the dashed dotted line Y1-Y2 in FIG. 1B. The cross section Y1-Y2 corresponds to a cross-sectional structure of part of a region where a conductive film provided under a semiconductor film and a conductive film provided over the semiconductor film are electrically connected to each other. FIGS. 11A to 12E each also illustrate the cross section Z1-Z2 taken along the dashed dotted line Z1-Z2 in FIG. 1C. The cross section Z1-Z2 corresponds to a cross-sectional structure of part of a region where a conductive film formed at the same time as conductive films that can function as a source electrode and a drain electrode of the transistor is electrically connected to two conductive films formed above the transistor.

The method for manufacturing a semiconductor device that is described in this embodiment can be applied to a case where a plurality of conductive films are formed above a transistor. For example, the method is suitable for a liquid crystal display device in an in-plane-switching (IPS) mode or a fringe field switching (FFS) mode where a common electrode and a pixel electrode are formed on the same substrate.

<<Manufacturing Method 5>>

Figure 11A:
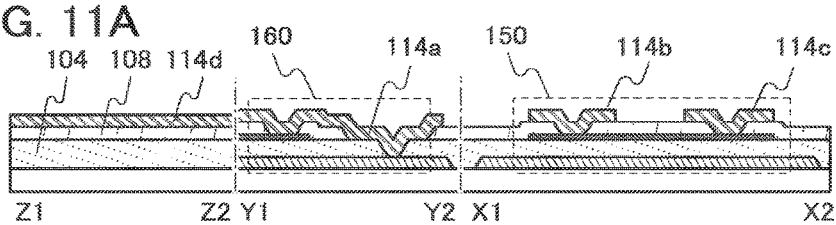
FIGS. 11A to 11E are cross-sectional views illustrating a method for manufacturing a semiconductor device that is one embodiment of the present invention.
Figure 11B:
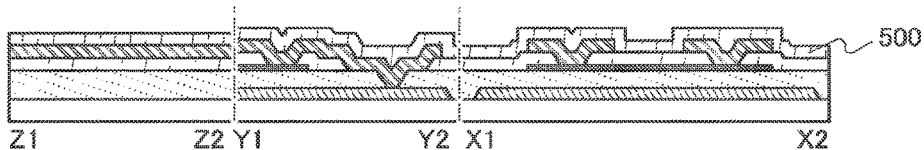
Figure 11C:
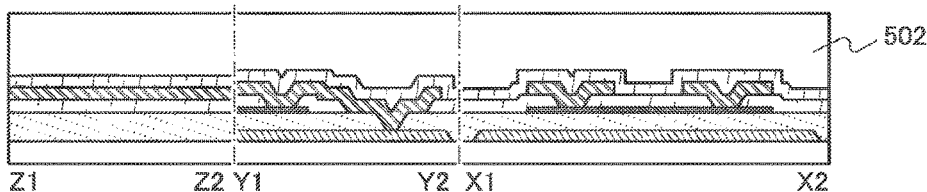
Figure 11D:
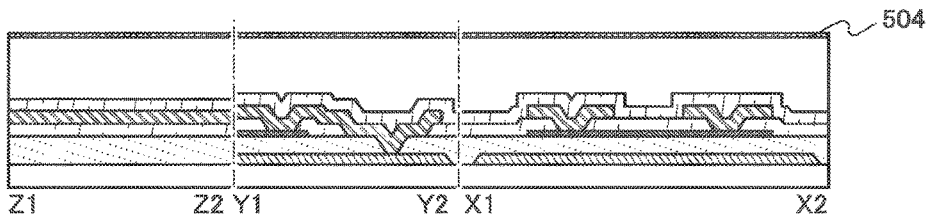
Figure 11E:
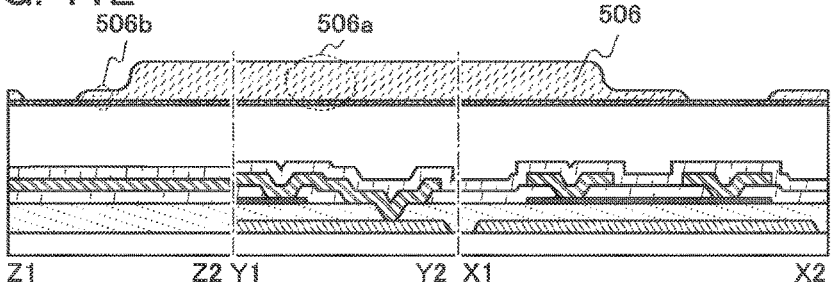
Figure 12A:
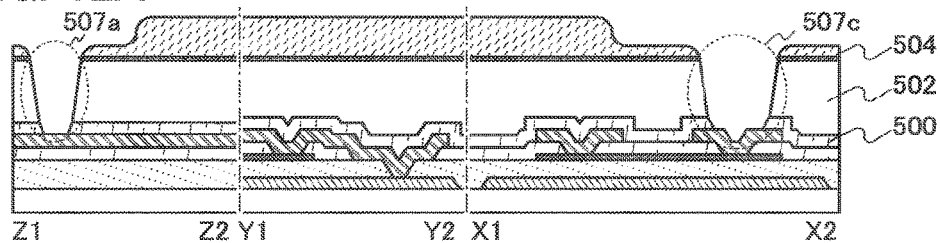
FIGS. 12A to 12E are cross-sectional views illustrating a method for manufacturing a semiconductor device that is one embodiment of the present invention.
Figure 12B:
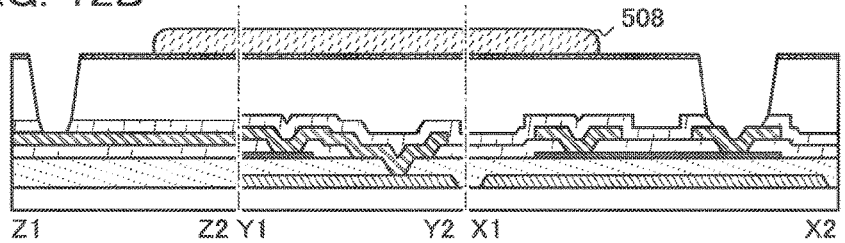
Figure 12C:
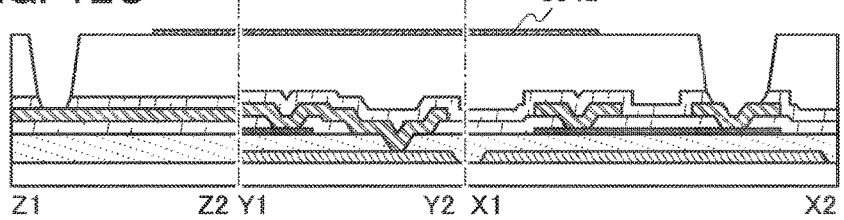
Figure 12D:
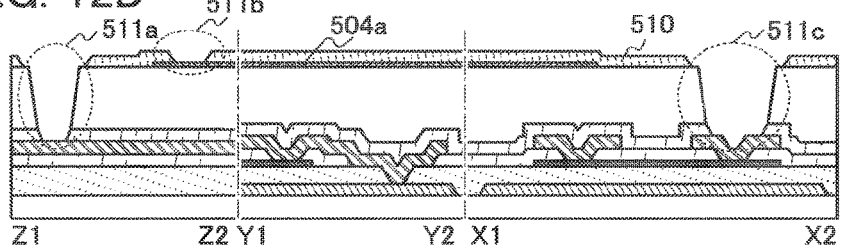
Figure 12E:
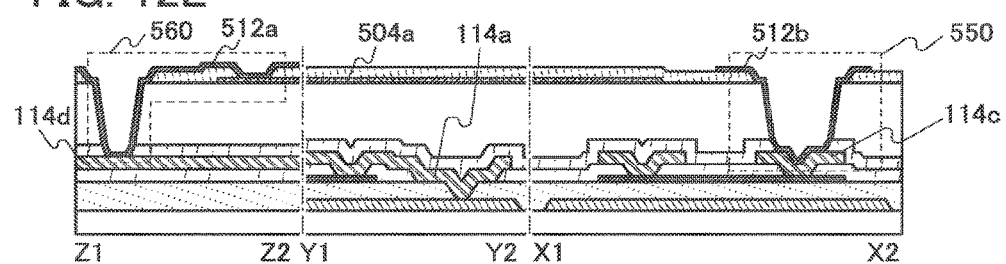

A method for forming a connection portion 550 and a connection portion 560, which are illustrated in FIG. 12E, is described with reference to FIGS. 11A to 11E and FIGS. 12A to 12E.

<Lower Structure>

First, a substrate provided with a conductive film is prepared. The substrate may be the substrate over which the transistor 150 and the connection portion 160 are formed that is described in Embodiment 1 or a substrate over which a conductive film having a different structure is formed by another method. The substrate is not limited to, for example, a substrate provided with the bottom-gate transistor 150 described in Embodiment 1 and may be a substrate provided with a top-gate transistor.

In this embodiment, a substrate provided with the transistor 150 in the cross section X1-X2 and the connection portion 160 in the cross section Y1-Y2, which are formed in a manner similar to that of the manufacturing method 2 in Embodiment 1, and the insulating film 104, the insulating film 108, and the conductive film 114d in the cross section Z1-Z2, which are formed through steps similar to those in the manufacturing method 2, is prepared (FIG. 11A). The conductive film 114d can be formed using a material, a structure, and a method similar to those of the conductive films 114a, 114b, and 114c. The connection portion 550 and the connection portion 560 are formed over the conductive film 114a and the conductive film 114d of the substrate through steps described below.

<Formation of Insulating Film>

An insulating film 500 is formed over the conductive films 114a, 114b, 114c, and 114d (FIG. 11B). The insulating film 500 can be formed using a material, a structure, and a method similar to those of the insulating film 104 in Embodiment 1.

<Formation of Insulating Film>

Next, an insulating film 502 is formed over the insulating film 500 (FIG. 11C). The insulating film 502 can function as a planarization film in the semiconductor device.

The insulating film 502 can be formed of a single layer or a stacked layer of, for example, acrylic, acrylamide, ester, and another known material.

<Formation of Conductive Film>

Next, a conductive film 504 is formed over the insulating film 502 (FIG. 11D). A light-transmitting material is preferably used for the conductive film 504.

For the conductive film 504, a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added can be used.

A conductive composition containing a conductive macromolecule (also referred to as a conductive polymer) can be used to form the conductive film 504. The sheet resistance of the light-transmitting conductive film formed using a conductive composition is preferably less than or equal to 10000 Ω/square and light transmittance thereof is preferably greater than or equal to 70% at a wavelength of 550 nm. Further, the resistivity of the conductive high molecule contained in the conductive composition is preferably 0.1 Ω·cm or less.

As the conductive high molecule, what is called a π-electron conjugated conductive polymer can be used. Examples are polyaniline and a derivative thereof, polypyrrole and a derivative thereof, polythiophene and a derivative thereof, and a copolymer of two or more of aniline, pyrrole, and thiophene and a derivative thereof.

The conductive film 504 can be formed of a single layer or a stacked layer of any of the materials given above.

<Formation of Mask and Etching of Conductive Film and Insulating Film>

Next, a resist mask 506 is formed over the conductive film 504 by a photolithography process (FIG. 11E). As illustrated in FIG. 11E, the resist mask 506 includes regions with different thicknesses: a region 506a and a region 506b with a thickness smaller than that of the region 506a. At least part of the region 506b overlaps the conductive film 504.

The resist mask 506 is formed by a photolithography process using a multi-tone mask (a half-tone photomask or a gray-tone photomask).

Next, portions of the insulating film 500, the insulating film 502, and the conductive film 504 that the resist mask 506 does not overlap are removed by etching to form an opening 507a and an opening 507c (FIG. 12A).

Next, ashing is performed on the resist mask 506. The ashing reduces the area (the volume in three dimensions) and thickness of the resist mask 506. Thus, part of the resist mask 506 that is in the region 506b and has a small thickness is removed to form a resist mask 508 (FIG. 12B). In other words, the part of the resist mask 506 that is in the region 506b is removed by making the resist mask 506 recede, whereby the resist mask 508 is formed.

The ashing can be performed with, for example, oxygen plasma.

Next, a portion of the conductive film 504 that the resist mask 508 does not overlap is removed by etching, and then the resist mask 508 is removed to form a conductive film 504a (FIG. 12C). The conductive film 504a can function as a common electrode in a liquid crystal display device.

<Formation of Insulating Film>

Next, an insulating film is formed over the conductive film 504a, the insulating film 502, the insulating film 500, the conductive film 114d, and the conductive film 114c, and a resist mask is formed over the insulating film by a photolithography process. After that, part of the insulating film is etched using the resist mask to form an insulating film 510 (FIG. 12D). As illustrated in FIG. 12D, an opening 511a is formed in part of the insulating film 510 that overlaps the opening 507a and an opening 511b is formed in part of the insulating film 510 that overlaps the conductive film 504a. In addition, an opening 511c is formed in part of the insulating film 510 that overlaps the opening 507c.

The insulating film 510 can be formed using a material, a structure, and a method similar to those of the insulating film 104 in Embodiment 1.

<Formation of Conductive Film>

Next, a conductive film is formed over the insulating film 510, the conductive film 504a, the insulating film 502, the insulating film 500, the conductive film 114d, and the conductive film 114c, and a resist mask is formed over the conductive film by a photolithography process. After that, part of the conductive film is etched using the resist mask to form a conductive film 512a and a conductive film 512b (FIG. 12E).

The conductive film 512a is electrically connected to the conductive film 114d and the conductive film 504a. The conductive film 512b is electrically connected to the conductive film 114c. The conductive film 512b can function as a pixel electrode in a liquid crystal display device. In addition, although not illustrated, a portion where the conductive film 504a and the conductive film 512b overlap each other can function as a capacitor. However, the capacitor is not limited thereto, and a portion other than the portion where the conductive film 504a and the conductive film 512b overlap each other can function as a capacitor. For example, a portion where the conductive film 504a and a conductive film formed separately overlap each other may function as a capacitor.

The conductive film 512a and the conductive film 512b can be formed using a material, a structure, and a method similar to those of the conductive film 504a.

Through the above-described steps, the connection portion 550 and the connection portion 560 can be formed.

In the manufacturing method 5, as described above, the use of the half-tone photomask enables the openings 507a and 507c and the conductive film 504a to be formed using one mask.

The above-described steps can reduce the number of masks and the number of photolithography processes. Thus, the manufacturing time and manufacturing cost of the semiconductor device can be reduced.

(Embodiment 3)

Figure 15A:
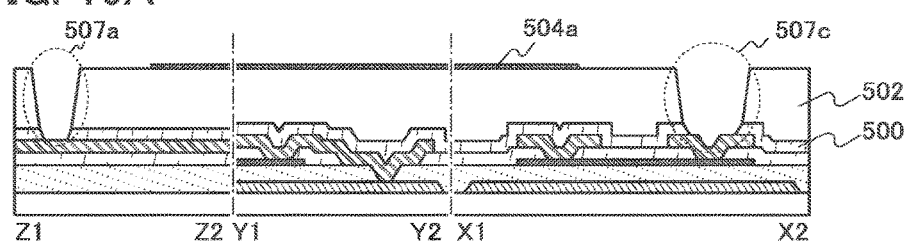
FIGS. 15A to 15C are cross-sectional views illustrating a method for manufacturing a semiconductor device that is one embodiment of the present invention.
Figure 15B:
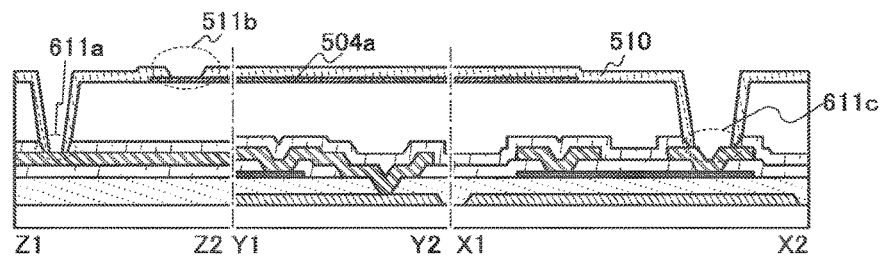
Figure 15C:
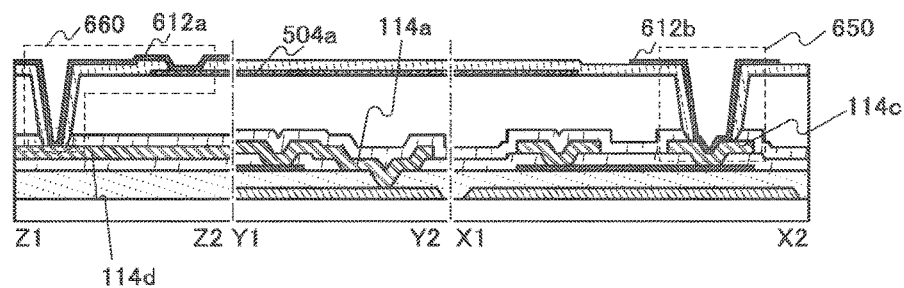

Another embodiment of the method for manufacturing a semiconductor device that is one embodiment of the present invention, which is described in Embodiment 2, is described with reference to FIGS. 1A to 1C and FIGS. 15A to 15C. FIGS. 1A to 1C are top views illustrating the semiconductor device as described above. FIGS. 15A to 15C each illustrate the cross section X1-X2 taken along the dashed dotted line X1-X2 in FIG. 1A. The cross section X1-X2 corresponds to a cross-sectional structure of part of a region where a transistor and a conductive film provided over the transistor are electrically connected to each other. FIGS. 15A to 15C each also illustrate the cross section Y1-Y2 taken along the dashed dotted line Y1-Y2 in FIG. 1B. The cross section Y1-Y2 corresponds to a cross-sectional structure of part of a region where a conductive film provided under a semiconductor film and a conductive film provided over the semiconductor film are electrically connected to each other. FIGS. 15A to 15C each also illustrate the cross section Z1-Z2 taken along the dashed dotted line Z1-Z2 in FIG. 1C. The cross section Z1-Z2 corresponds to a cross-sectional structure of part of a region where a conductive film formed at the same time as conductive films that can function as a source electrode and a drain electrode of the transistor is electrically connected to two conductive films formed above the transistor.

The method for manufacturing a semiconductor device that is described in this embodiment can be applied to a case where a plurality of conductive films are formed above a transistor. For example, the method is suitable for a liquid crystal display device in an in-plane-switching (IPS) mode or a fringe field switching (FFS) mode where a common electrode and a pixel electrode are formed on the same substrate.

<<Manufacturing Method 6>>

A method for forming a connection portion 650 and a connection portion 660, which are illustrated in FIG. 15C, is described with reference to FIGS. 15A to 15C. The steps up to and including the formation of the conductive film 504a in the method for manufacturing a semiconductor device that is one embodiment of the present invention, which is described in this embodiment, are similar to those in the manufacturing method 5 in Embodiment 2; therefore, the manufacturing method 5 can be referred to for the steps up to and including the formation of the conductive film 504a. FIG. 15A is a cross-sectional view illustrating a state after the steps up to the formation of the conductive film 504a. The conductive film 504a, the opening 507a, and the opening 507c are formed using one multi-tone mask (a half-tone photomask or a gray-tone photomask), resulting in the reduced numbers of masks and photolithography processes. Thus, the manufacturing time and manufacturing cost of the semiconductor device can be reduced.

<Formation of Insulating Film>

Next, an insulating film is formed over the conductive film 504a, the insulating film 502, the insulating film 500, the conductive film 114c, and the conductive film 114d, and a resist mask is formed over the insulating film by a photolithography process. Then, part of the insulating film is etched using the resist mask to form an insulating film 610 (FIG. 15B). As illustrated in FIG. 15B, an opening 611a is formed in the insulating film 610 inside the opening 507a, and the opening 511b is formed in part of the insulating film 610 that overlaps the conductive film 504a. In addition, an opening 611c is formed inside the opening 507c.

Unlike the manufacturing method 5 in Embodiment 2, the insulating film 610 is also formed inside the opening 507a and the opening 507c. Thus, the side surfaces of the insulating film 502 in the opening 507a and the opening 507c are covered with the insulating film 610. This structure can suppress diffusion of impurities inside the insulating film 502 or impurities and the like attached to the side surfaces of the insulating film 502 in the opening 507a and the opening 507c in a step such as ashing of the multi-tone mask to the outside of the insulating film 502. When the impurities are mixed in liquid crystal in, for example, a liquid crystal display device described later in Embodiment 4, the liquid crystal deteriorates. The suppression of diffusion of the impurities by the insulating film 502 can prevent the deterioration of the liquid crystal display device.

<Formation of Conductive Film>

Next, a conductive film is formed over the insulating film 610, the conductive film 504a, the insulating film 502, the insulating film 500, the conductive film 114c, and the conductive film 114d, and a resist mask is formed over the conductive film by a photolithography process. After that, part of the conductive film is etched using the resist mask to form a conductive film 612a and a conductive film 612b (FIG. 15C).

The conductive film 612a is electrically connected to the conductive film 114d and the conductive film 504a. The conductive film 612b is electrically connected to the conductive film 114c. The conductive film 612b can function as a pixel electrode in a liquid crystal display device. In addition, although not illustrated, a portion where the conductive film 504a and the conductive film 612b overlap each other can function as a capacitor. However, the capacitor is not limited thereto, and a portion other than the portion where the conductive film 504a and the conductive film 612b overlap each other can function as a capacitor. For example, a portion where the conductive film 504a and a conductive film formed separately overlap each other may function as a capacitor.

The conductive film 612a and the conductive film 612b can be formed using a material, a structure, and a method similar to those of the conductive film 504a.

Through the above-described steps, the connection portion 650 and the connection portion 660 can be formed.

As is understood from the cross-sectional views of FIGS. 15A to 15C, the insulating film 500, the insulating film 502, and the insulating film 610 may have tapered side surfaces in the connection portion 650 and the connection portion 660. The insulating film 500, the insulating film 502, and the insulating film 610 that have the tapered side surfaces make the conductive film 612a and the conductive film 612b also have tapered shapes in the connection portion 650 and the connection portion 660. When the insulating film 500, the insulating film 502, and the insulating film 610 have upright side surfaces in the connection portion 650 and the connection portion 660, the conductive film 612a and the conductive film 612b cannot be formed sufficiently, resulting in disconnection of the conductive film 612a and the conductive film 612b. In contrast, when the insulating film 500, the insulating film 502, and the insulating film 610 have the tapered side surfaces, the disconnection of the conductive film 612a and the conductive film 612b can be prevented, resulting in the improved reliability of the semiconductor device.

As described above, in the manufacturing method 6, the use of the half-tone mask enables the opening 507a, the opening 507c, and the conductive film 504a to be formed using one mask. In addition, diffusion of impurities from the side surfaces of the insulating film 502 can be suppressed.

The above-described steps can reduce the number of masks and the number of photolithography processes. Thus, the manufacturing time and manufacturing cost of the semiconductor device can be reduced. In addition, the semiconductor device can be used without a decrease in the reliability.

(Embodiment 4)

In this embodiment, a semiconductor device such as a display device, to which any of the methods for manufacturing a semiconductor device described in Embodiments 1 to 3 can be applied, is described.

The manufacturing method described in Embodiment 1 can be suitably used as a method for manufacturing a switching element of an active matrix liquid crystal display device and can be applied to liquid crystal display devices in a variety of modes such as a twisted nematic (TN) mode, a vertical alignment (VA) mode, and an IPS mode.

The manufacturing method described in Embodiment 1 can also be suitably used as a method for manufacturing a switching element of a light-emitting device including an active matrix organic EL element.

The manufacturing method described in Embodiment 2 and Embodiment 3 can be suitably used as a method for manufacturing a switching element of particularly, a liquid crystal display device in an IPS mode. In this case, a pixel electrode having slits is formed. The stacking order of the pixel electrode and the common electrode in Embodiment 2 and Embodiment 3 may be switched to form a common electrode having slits.

The manufacturing methods described in Embodiments 1 to 3 can be suitably used as a method for manufacturing a semiconductor device such as a memory device, an arithmetic device, a CPU, or a microcomputer, without limitation to a display device and a light-emitting device.

A liquid crystal display device 1000 in an IPS (FFS) mode, in which the semiconductor device described in Embodiment 1 is used, is described below as an example of a semiconductor device with reference to FIGS. 13A to 13C.

Figure 13A:
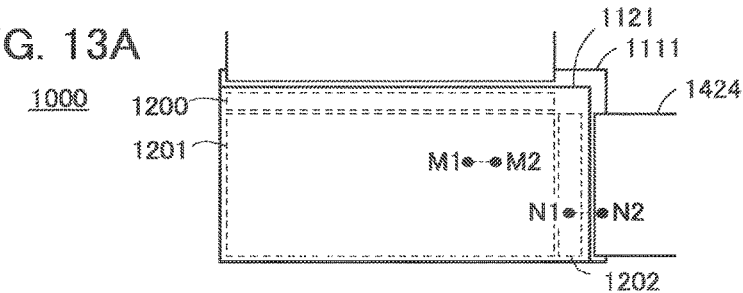
FIGS. 13A to 13C illustrate a liquid crystal display device.

FIG. 13A is a top view of the liquid crystal display device 1000. FIG. 13B illustrates the cross section M1-M2 taken along the dashed line M1-M2 in FIG. 13A. The cross section M1-M2 corresponds to a cross-sectional structure of a region where the transistor 150 described in Embodiment 1 is formed, and the region can function as a pixel region of the liquid crystal display device. FIG. 13C illustrates the cross section N1-N2 taken along the dashed line N1-N2 in FIG. 13A. The region illustrated in the cross section N1-N2 can function as a peripheral portion where a driver and the like are provided and a connection portion in the liquid crystal display device.

As illustrated in FIG. 13A, the liquid crystal display device 1000 includes a pixel portion 1201, a driver 1200, and a driver 1202 between a substrate 1111 and a substrate 1121.

Figure 13B:
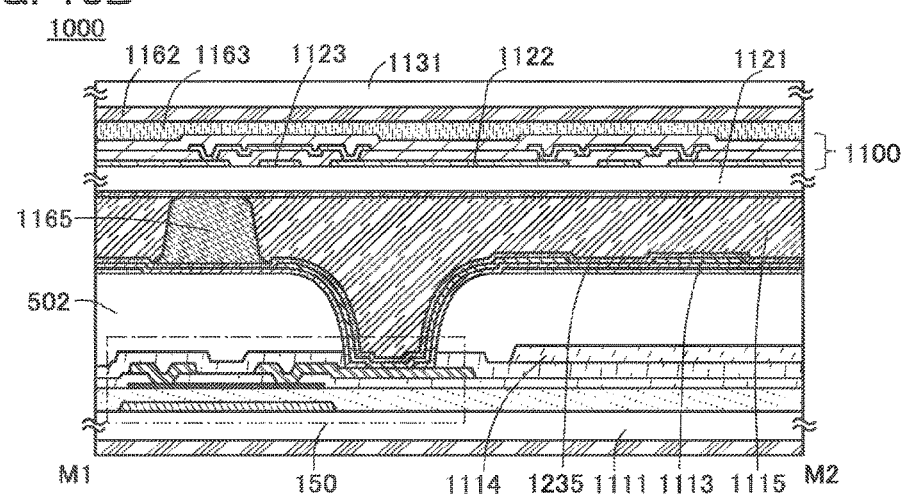
Figure 13C:
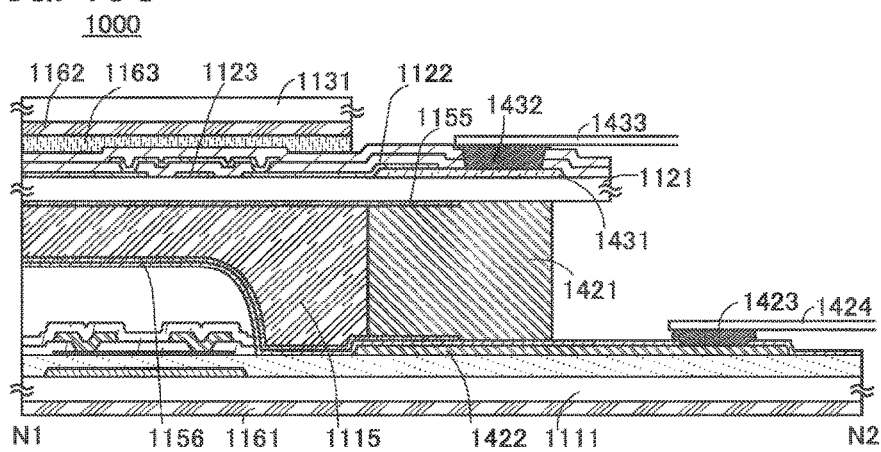

As illustrated in FIGS. 13B and 13C, the liquid crystal display device 1000 also includes the transistor 150 over the substrate 1111. The liquid crystal display device 1000 also includes a polarizing plate 1161, a liquid crystal layer 1115, a substrate 1121, a touch panel portion 1100, a bonding layer 1163, a polarizing plate 1162, a substrate 1131, and the like. The touch panel portion 1100 includes an electrode 1122, an electrode 1123, and the like. In addition, an alignment film 1155 and an alignment film 1156 are provided over and under the liquid crystal layer, and a spacer 1165 is provided in order to retain a cell gap of the liquid crystal layer. In addition, a color filter 1114 is provided in a portion that does not overlap the transistor 150, and a conductive film 1113 and a conductive film 1235 are formed to overlap the color filter 1114.

In a terminal portion, the substrate 1121 and the substrate 1111 are bonded to each other by a sealing material 1421. An electrode 1122 and an FPC 1433 are electrically connected to each other through a conductive film 1431 and a conductive film 1432. A conductive film 1422 and an FPC 1424 are electrically connected to each other through a conductive film 1423.

Although the structure in which the insulating film 502 that can function as a planarization film is provided is illustrated in FIGS. 13A to 13C, one embodiment of the present invention is not limited to the structure. A display device may have a structure in which the insulating film 502 is not provided.

(Embodiment 5)

In this embodiment, examples of an electronic appliance including a liquid crystal display device to which one embodiment of the present invention is applied are described with reference to FIGS. 14A to 14E.

Electronic appliances described in this embodiment each include the liquid crystal display device of one embodiment of the present invention in a display portion.

Examples of an electronic appliance including the liquid crystal display device are television devices (also referred to as televisions or television receivers), monitors of computers or the like, digital cameras, digital video cameras, digital photo frames, mobile phone sets (also referred to as mobile phones or mobile phone devices), portable game machines, portable information terminals, audio reproducing devices, and large-sized game machines such as pachinko machines. Specific examples of these electronic appliances are illustrated in FIGS. 14A to 14E.

Figure 14A:
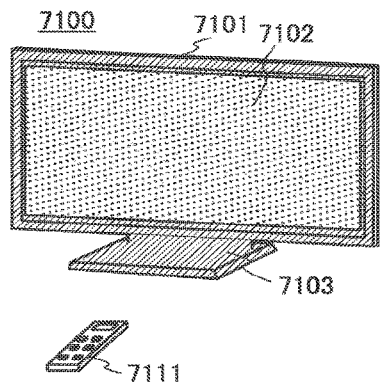
FIGS. 14A to 14E illustrate electronic appliances.

FIG. 14A illustrates an example of a television device. In a television device 7100, a display portion 7102 is incorporated in a housing 7101. Images can be displayed on the display portion 7102. The liquid crystal display device to which one embodiment of the present invention is applied can be used for the display portion 7102. In addition, here, the housing 7101 is supported by a stand 7103.

The television device 7100 can be operated with an operation switch of the housing 7101 or a separate remote controller 7111. With operation keys of the remote controller 7111, channels and volume can be controlled and images displayed on the display portion 7102 can be controlled. The remote controller 7111 may be provided with a display portion for displaying data output from the remote controller 7111.

Note that the television device 7100 is provided with a receiver, a modem, and the like. With the use of the receiver, general television broadcasting can be received. Moreover, when the television device is connected to a communication network with or without wires via the modem, one-way (from a sender to a receiver) or two-way (between a sender and a receiver or between receivers) information communication can be performed.

Figure 14B:
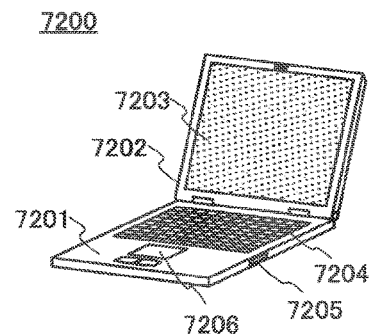

FIG. 14B illustrates an example of a computer. A computer 7200 includes a main body 7201, a housing 7202, a display portion 7203, a keyboard 7204, an external connection port 7205, a pointing device 7206, and the like. The computer is manufactured using the liquid crystal display device of one embodiment of the present invention for the display portion 7203.

Figure 14C:
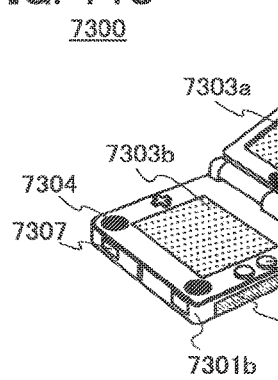

FIG. 14C illustrates an example of a portable game machine. A portable game machine 7300 has two housings, a housing 7301a and a housing 7301b, which are connected with a joint portion 7302 so that the portable game machine can be opened and closed. The housing 7301a incorporates a display portion 7303a, and the housing 7301b incorporates a display portion 7303b. In addition, the portable game machine illustrated in FIG. 14C includes a speaker portion 7304, a recording medium insertion portion 7305, an operation key 7306, a connection terminal 7307, a sensor 7308 (a sensor having a function of measuring or sensing force, displacement, position, speed, acceleration, angular velocity, rotational frequency, distance, light, liquid, magnetism, temperature, chemical substance, sound, time, hardness, electric field, electric current, voltage, electric power, radiation, flow rate, humidity, gradient, oscillation, odor, or infrared rays), an LED lamp, a microphone, and the like. It is needless to say that the structure of the portable game machine is not limited to the above structure as long as the liquid crystal display device of one embodiment of the present invention is used for at least either the display portion 7303a or the display portion 7303b, or both, and may include other accessories as appropriate. The portable game machine illustrated in FIG. 14C has a function of reading out a program or data stored in a recoding medium to display it on the display portion, and a function of sharing information with another portable game machine by wireless communication. Note that a function of the portable game machine illustrated in FIG. 14C is not limited to them, and the portable game machine can have a variety of functions.

Figure 14D:
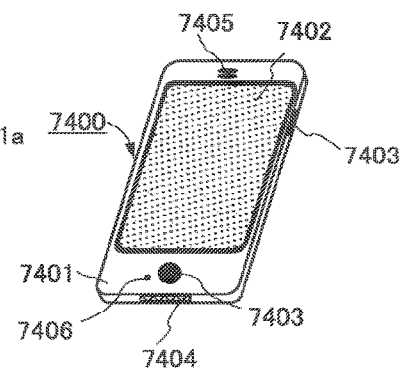

FIG. 14D illustrates an example of a mobile phone. A mobile phone 7400 is provided with a display portion 7402 incorporated in a housing 7401, an operation button 7403, an external connection port 7404, a speaker 7405, a microphone 7406, and the like. Note that the mobile phone 7400 is manufactured using the liquid crystal display device of one embodiment of the present invention for the display portion 7402.

When the display portion 7402 of the mobile phone 7400 illustrated in FIG. 14D is touched with a finger or the like, data can be input to the mobile phone 7400. In addition, operations such as making a call and creating e-mail can be performed by touch on the display portion 7402 with a finger or the like.

There are mainly three screen modes of the display portion 7402. The first mode is a display mode mainly for displaying an image. The second mode is an input mode mainly for inputting data such as characters. The third mode is a display-and-input mode in which two modes of the display mode and the input mode are combined.

For example, in the case of making a call or creating e-mail, a character input mode mainly for inputting characters is selected for the display portion 7402 so that characters displayed on the screen can be input.

When a sensing device including a sensor such as a gyroscope sensor or an acceleration sensor for sensing inclination is provided inside the mobile phone 7400, display on the screen of the display portion 7402 can be automatically changed in direction by determining the orientation of the mobile phone 7400 (whether the mobile phone 7400 is placed horizontally or vertically for a landscape mode or a portrait mode).

The screen modes are changed by touch on the display portion 7402 or operation with the operation button 7403 of the housing 7401. The screen modes can be switched depending on the kind of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, if a signal detected by an optical sensor in the display portion 7402 is detected and the input by touch on the display portion 7402 is not performed for a certain period, the screen mode may be controlled so as to be changed from the input mode to the display mode.

The display portion 7402 may function as an image sensor. For example, an image of a palm print, a fingerprint, or the like is taken by touch on the display portion 7402 with the palm or the finger, whereby personal authentication can be performed. Further, when a backlight or a sensing light source which emits near-infrared light is provided in the display portion, an image of a finger vein, a palm vein, or the like can be taken.

Figure 14E:
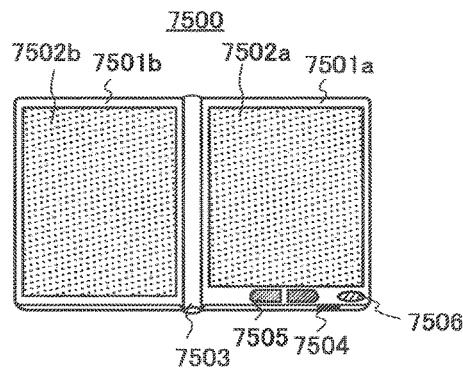

FIG. 14E illustrates an example of a foldable tablet terminal (which is unfolded). A tablet terminal 7500 includes a housing 7501a, a housing 7501b, a display portion 7502a, and a display portion 7502b. The housing 7501a and the housing 7501b are connected by a hinge 7503 and can be opened and closed using the hinge 7503 as an axis. The housing 7501a includes a power switch 7504, operation keys 7505, a speaker 7506, and the like. Note that the tablet terminal 7500 is manufactured using the liquid crystal display device of one embodiment of the present invention for either the display portion 7502*a* or the display portion 7502*b*, or both.

Part of the display portion 7502*a* or the display portion 7502*b* can be used as a touch panel region, where data can be input by touching displayed operation keys. For example, a keyboard can be displayed on the entire region of the display portion 7502*a* so that the display portion 7502*a* is used as a touch screen, and the display portion 7502*b* can be used as a display screen.

This embodiment can be combined with any of the other embodiments as appropriate.

This application is based on Japanese Patent Application serial no. 2013-078908 filed with the Japan Patent Office on Apr. 4, 2013, the entire contents of which are hereby incorporated by reference.

What is claimed is:

1. A semiconductor device comprising:
   a first conductive layer over a substrate;
   a first insulating film over the first conductive layer;
   an oxide semiconductor film over the first insulating film;
   a second insulating film over the oxide semiconductor film;
   a second conductive layer over the second insulating film;
   a third insulating film over the second conductive layer;
   a fourth insulating film over the third insulating film; and
   a third conductive layer over the fourth insulating film,
   wherein the first conductive layer includes a region overlapping with the oxide semiconductor film,
   wherein the first insulating film includes a first opening in a region overlapping with the first conductive layer,
   wherein the second insulating film includes a second opening in a region overlapping with the first conductive layer, and a third opening in a region overlapping with the oxide semiconductor film,
   wherein the second insulating film has a tapered side surface in the second opening,
   wherein a top of the tapered side surface is located outside the first opening in a plan view,
   wherein the second conductive layer includes a region in contact with the first conductive layer through the first opening and the second opening, and a region in contact with the oxide semiconductor film through the third opening, and
   wherein the third conductive layer includes a region overlapping with the first opening through the third insulating film and the fourth insulating film.

2. The semiconductor device according to claim 1, wherein the second insulating film has a tapered side surface in the third opening.

3. The semiconductor device according to claim 1, wherein the semiconductor device is one selected from the group consisting of a television device, a computer, a portable game machine, a mobile phone, and a tablet terminal.

4. A semiconductor device comprising:
   a first conductive layer over a substrate;
   a first insulating film over the first conductive layer;
   an oxide semiconductor film over the first insulating film;
   a second insulating film over the oxide semiconductor film;
   a second conductive layer over the second insulating film;
   a third insulating film over the second conductive layer;
   a fourth insulating film over the third insulating film; and
   a third conductive layer over the fourth insulating film,
   wherein the first conductive layer includes a region overlapping with the oxide semiconductor film,
   wherein the first insulating film includes a first opening in a region overlapping with the first conductive layer,
   wherein the second insulating film includes a second opening in a region overlapping with the first conductive layer, and a third opening in a region overlapping with the oxide semiconductor film,
   wherein the second insulating film has a tapered side surface in the second opening,
   wherein a top of the tapered side surface is located outside the first opening in a plan view,
   wherein the second conductive layer includes a region in contact with the first conductive layer through the first opening and the second opening, and a region in contact with the oxide semiconductor film through the third opening, and
   wherein the third conductive layer includes a region overlapping with the third opening through the third insulating film and the fourth insulating film.

5. The semiconductor device according to claim 4, wherein the second insulating film has a tapered side surface in the third opening.

6. The semiconductor device according to claim 4, wherein the semiconductor device is one selected from the group consisting of a television device, a computer, a portable game machine, a mobile phone, and a tablet terminal.

* * * * *